US006359371B1

(12) United States Patent
Perkins et al.

(10) Patent No.: US 6,359,371 B1
(45) Date of Patent: Mar. 19, 2002

(54) INERTIAL/AUDIO UNIT AND CONSTRUCTION

(75) Inventors: Richard Perkins, Malden; Gerald Caron, Andover; Erik Saarmaa, Boston, all of MA (US)

(73) Assignee: Active Control eXperts, Inc., Cambridge, MA (US)

( * ) Notice: Subject to any disclaimer, the term of this patent is extended or adjusted under 35 U.S.C. 154(b) by 0 days.

(21) Appl. No.: 09/420,532

(22) Filed: Oct. 19, 1999

Related U.S. Application Data

(63) Continuation of application No. 09/045,750, filed on Mar. 20, 1998
(60) Provisional application No. 60/105,033, filed on Oct. 20, 1998.

(51) Int. Cl.[7] ............ H01L 41/08
(52) U.S. Cl. ............ 310/328; 310/311; 310/354
(58) Field of Search ............ 310/311, 328, 310/354

(56) References Cited

U.S. PATENT DOCUMENTS

| | | | | |
|---|---|---|---|---|
| 2,045,404 A | * | 6/1936 | Nicholides | 310/348 |
| 2,877,362 A | * | 3/1959 | Tibbetts | 310/348 |
| 4,233,680 A | | 11/1980 | Sudler et al. | 368/76 |
| 4,395,665 A | | 7/1983 | Buchas | 348/114 |
| 4,604,606 A | | 8/1986 | Sweany | 340/384 |
| 4,680,492 A | * | 7/1987 | Tamura | 310/15 |
| 4,710,655 A | | 12/1987 | Masaki | 310/30 |
| 4,731,603 A | | 3/1988 | McRae et al. | 340/407 |
| 4,761,582 A | * | 8/1988 | McKee | 310/322 |
| 4,786,889 A | | 11/1988 | Hayasaka | 340/311.1 |
| 4,823,110 A | | 4/1989 | Dorward et al. | 340/388 |
| 4,851,836 A | | 7/1989 | Wilkinson et al. | 340/944 |
| 4,918,438 A | | 4/1990 | Yamasaki | 340/825.46 |
| 4,931,765 A | | 6/1990 | Rollins et al. | 340/407 |
| 4,973,941 A | | 11/1990 | Davis et al. | 340/384 |
| 5,023,504 A | | 6/1991 | Mooney et al. | 310/322 |
| 5,107,540 A | | 4/1992 | Mooney et al. | 381/192 |

(List continued on next page.)

FOREIGN PATENT DOCUMENTS

| | | | | |
|---|---|---|---|---|
| EP | 0 724 243 A | | 7/1996 | G08B/3/10 |
| JP | 8-314467 | * | 11/1996 | 310/348 |

*Primary Examiner*—Thomas M. Dougherty
(74) *Attorney, Agent, or Firm*—Testa Hurwitz & Thibeault LLP

(57) ABSTRACT

An electrically driven signal unit is adapted for one-step assembly or injection molding with a device housing to vibrate, flex, beep or emit audio signals, or to sense and provide tactile feedback or control. The signal unit is a package with one or more active areas each containing a layer of ferroelectric or piezoelectric material, connected by inactive areas which may position, align and conduct electricity to the active areas. The active areas may be coupled over a region to transmit compressional, shear or flexural wave energy into the housing, or may contact at discrete regions while bending or displacing elsewhere to create inertial disturbances or impulses which are coupled to create a tactile vibration of the housing. The unit may be assembled such that the housing, the sheet or discrete areas thereof form a bender to provide tactile or sub-auditory signals to the user, or may be dimensioned, attached and actuated to produce audio vibration in the combined structure and constitute a speaker. In other embodiments one or more active regions of piezo material are attached to thin or movable wall regions of the unit to sense strain and, in conjunction with a conditioning circuit, produce electrical switching or control signals for the device. Other embodiments include devices having a tight tolerance between a housing wall and a signal module, and devices having one or more through-holes located on the housing wall. The invention also includes electroactive sheet structures having a polymer block, bracket or functional body formed therearound, which serves as a mounting, coupling or functional operating structure for the driven device.

7 Claims, 19 Drawing Sheets

U.S. PATENT DOCUMENTS

| | | | | | |
|---|---|---|---|---|---|
| 5,172,092 | A | | 12/1992 | Nguyen et al. | 340/311.1 |
| 5,229,744 | A | | 7/1993 | Ogura | 340/311.1 |
| 5,245,245 | A | * | 9/1993 | Goldenberg | 310/330 |
| 5,293,161 | A | | 3/1994 | MacDonald et al. | 340/825.46 |
| 5,327,120 | A | | 7/1994 | McKee et al. | 340/825.46 |
| 5,379,032 | A | | 1/1995 | Foster et al. | 340/825.46 |
| 5,406,161 | A | * | 4/1995 | Lee et al. | 310/324 |
| 5,436,622 | A | | 7/1995 | Gutman et al. | 340/825.46 |
| 5,488,351 | A | | 1/1996 | Hedayatnia et al. | 340/407.1 |
| 5,517,574 | A | | 5/1996 | Tichy | 381/188 |
| 5,524,061 | A | | 6/1996 | Mooney et al. | 381/151 |
| 5,528,697 | A | | 6/1996 | Saito | 381/192 |
| 5,546,069 | A | | 8/1996 | Holden et al. | 340/407.1 |
| 5,602,432 | A | | 2/1997 | Mizutani | 310/15 |
| 5,619,181 | A | | 4/1997 | Murray | 340/407.1 |
| 5,638,456 | A | | 6/1997 | Conley et al. | 381/190 |
| 5,642,413 | A | | 6/1997 | Little | 379/373 |
| 5,649,020 | A | | 7/1997 | McClurg et al. | 381/151 |
| 5,682,132 | A | | 10/1997 | Hiroyoshi et al. | 340/407.1 |
| 5,696,497 | A | | 12/1997 | Mottier et al. | 340/825.44 |
| 5,708,726 | A | | 1/1998 | Brinkley et al. | 381/200 |
| 5,754,096 | A | | 5/1998 | Muto et al. | 340/407.1 |
| 5,780,958 | A | * | 7/1998 | Strugach et al. | 310/348 |
| 5,796,854 | A | | 8/1998 | Markow | 381/188 |

* cited by examiner

| Vol (in*3) | C (in/s) | Lport(phys) | Lport (in) | port dia (in) | f theor (Hz) | f meas (Hz) | f delta % |
|---|---|---|---|---|---|---|---|
| 0.10 | 13572 | 0.03 | 0.081 | 0.06 | 1270 | 950 | 0.75 |
| 0.10 | 13572 | 0.03 | 0.098 | 0.08 | 1540 | 1100 | 0.71 |
| 0.10 | 13572 | 0.03 | 0.115 | 0.10 | 1777 | 1500 | 0.84 |
| 0.10 | 13572 | 0.03 | 0.132 | 0.12 | 1990 | 1700 | 0.85 |
| 0.10 | 13572 | 0.03 | 0.149 | 0.14 | 2186 | 1880 | 0.86 |

INERTIAL/AUDIO UNIT AND CONSTRUCTION

RELATED APPLICATIONS

This application claims priority to U.S. application Ser. No. 60/105,033, filed Oct. 20, 1998, and is a continuation-in-part of U.S. application Ser. No. 09/045,750, filed Mar. 20, 1998, both of which are incorporated by reference herein.

FIELD OF THE INVENTION

The present invention relates generally to signal alert devices such as loud speakers, voice messaging systems, and tone generators, and also relates to buzzers, vibrators and devices used for generating a vibration or inertial signal which may be felt or sensed while not producing a highly audible sound. Assemblies of this latter type in the prior art are used, for example, to signal a query by or an active state of a beeper, pager or alarm system, or to otherwise indicate an attention-getting state of a consumer device.

BACKGROUND OF THE INVENTION

A number of reasonably inexpensive and effective constructions have evolved in the prior art for providing signal units to generate the necessary tones or vibrations for these devices. These include miniature motors with imbalanced rotors to create a sensible vibration; small piezo electric assemblies to vibrate at an audio frequency and create a tone or beep noise; and other, older technologies such as speakers with an electromagnetic voice coil, or a magnetic solenoid driving a diaphragm to create a sound such as an audio tone or a vibratory buzz.

In general, each of these technologies or its method of incorporation in a device has certain limitations such as requiring a high voltage driver or a relatively high current driver; imposing penalties of weight and/or size; increasing the difficulty or cost of assembly into the electronic apparatus in which it is to operate; or requiring special engineering to increase the hardiness or lifetime of the device when installed for its intended conditions of use.

Thus, for example, as applied to an item such as a hand-held pager, which is required to be of extremely small size and low electrical power consumption, yet which is frequently dropped and subject to extreme impact, the defined constraints do not favor either electromagnetic motors, which require a comparatively large amount of electrical power, nor piezoelectric elements, which are sensitive to shock and generally require a case or other structural support to sustain vibration without suffering electrode detachment or crystal breakage. Nonetheless, such subassemblies are commonly used in devices of this kind.

Moreover, piezoelectric assemblies have been used for a variety of tone-generating tasks, both in earphones, and in larger, more complex, speaker constructions. In U.S. Pat. No. 5,638,456 one method has been proposed for placing piezo elements on the cover or housing of a laptop computer to form an audio system for the computer. Proposals of this type, however, must address not only the problems noted above, but may be required to achieve a degree of fidelity or uniformity of response over their tonal range which is competitive with conventional speaker technologies. Such a goal, if achieved, may be expected to necessitate an unusual mounting geometry, a special cavity or horn, a compensated audio driver, or other elements to adapt the piezo elements to their task or enhance their performance. Thus, not only the sound generator, but its supporting or conditioning elements may require mounting in the device, and these may all require special shaping or other adaptation to be effectively connected to, or to generate signals in, the device.

There is therefore a need for an efficient and durable signal generator which is better suited to the electrical devices of modern consumer taste.

Accordingly, it would be desirable to provide an improved signal generator effective for producing audio or inertial signals.

It would also be desirable to provide a sound/inertial unit of simple construction but readily adapted to device housings of diverse size and shape.

It would also be desirable to provide a sound/inertial unit of simple construction but adapted to processes of manufacture with the device housing.

It would further be desirable to provide such a sound or inertial generator assembly adapted to simplified and more effective installation in a consumer device.

SUMMARY OF THE INVENTION

These and other features are obtained in an audio/inertial signal generator in accordance with the present invention, wherein an actuator includes an electrically actuable member formed of a material such as a ferroelectric or piezo material, which generates acoustic or mechanical signals and is mechanically in contact with a body of polymer material. In one embodiment the member is assembled to a region of a wall or surface, for example, of a housing, and imparts energy thereto. The electrically actuable or piezoelectric member, which may for example cover a region having a dimension approximately one half to three or more centimeters on each side, is preferably compression-bonded to one or more electroded sheets, such as flex circuits, or to a patterned metal shim or the like, which enclose and reinforce the material while providing electrical connection extending over the signal generation unit. The lamination or compression bonding provides structural integrity, for example by stiffening or binding the member, and prevents structural cracks and electrode delamination from developing due to bending, vibration or impact. This construction strengthens and enables the piezo member, which is preferably a sheet or layer with relatively large length and width dimensions compared to its thickness, to be actuated as a single body and engage in vibration or relatively fast changes of state, or more generally, to produce electrically driven displacement, deformation or vibration of the device. That is, it effectively transmits acoustic or mechanical energy through the housing to which it is attached, and, in fact, the housing itself further functions to transmit acoustic or mechanical energy. This increases the overall efficiency of the system. The system radiates sound both directly and by transmitting energy into its own structural components, or into any structure closely associated with the system. For example, the system can transmit energy into and through a hand-held device, a circuit board, a computer, a compact disk player, a cell phone, a mount such as a belt clip, or even a person. Thus, in an acoustical embodiment of the invention, no grill or vent is required to permit the transmission of acoustic energy. The structure is adapted for assembly or forming with the housing, and may be installed by cementing together or by a spot fastening process. Preferably, however, the actuable member is formed with or manufactured into the wall or housing by a process such as injection molding wherein the molded body of the device is formed into all or part of a bounding surface of the signal generator, or wherein a solid block of polymer, or collar, holds the actuable assembly and is itself joined to the housing by fasteners or compatible bonding agents.

The piezo member has the form of a thin layer or sheet, which may extend in a branched or multi-area shape, and may be fabricated with both mechanically active regions and non-mechanically active, or "inactive", regions. The active regions contain electroded electroactive material, whereas the inactive regions may be regions disjoint from the mechanically active regions and may be shaped or located to position and provide structural support and/or electrical pathways, e.g., mounting hole and electrical lead-in connections, to the active regions. The inactive regions may include non-electroded electroactive material, or may lack the material altogether and contain only electrical lead-ins, cover film, or the like. Portions of the signal unit may be pinned in an injection mold and a device housing then molded about or adjacent to the unit, or else may be positioned and then cemented or thermally bonded to the housing after the housing has been molded, thereby simplifying fabrication of the final device. In one embodiment, the signal unit is a vibrating beam or sheet which may be pinned, clamped or otherwise attached at one or more positions along its length, leaving a portion free to displace and create inertial impulses which are coupled to the housing at the fixed or clamped portion. In that case, the fixed portion may be defined by a block of polymer material molded about the electroactive assembly, thus providing an inert and machinable or clampable region for affixing to the device. In another embodiment, the unit is fastened to or contained within a wall of the device's housing, and couples energy thereto such that the wall acts as a tone-radiating surface. The unit is preferably mechanically connected over a major portion of its surface and activated to produce waves in the attached housing, so that the housing itself forms a novel radiating surface. The signal assembly may have plural separate active regions which are connected, in common or separately, to different portions of the housing wall, and which may be operated variously as sensing switches, audio speakers covering one or more frequency bands, or tactile sub-audio signal indicators. The separate active regions may also be attached to the housing at separated positions and be driven in phased relation to more effectively create particular excitations of regions of the wall , or may be driven as independent pairs to produce stereo sound.

In one exemplary embodiment, the housing is the housing of a laptop or other computer, and the signal assembly includes two flat piezo transducers, each having one or more active regions for producing audio vibration, and which are co-fabricated with the housing by a molding or thermal bonding assembly process to form stereo audio emitters. In another embodiment, the housing is the body of a computer mouse and the generator is coupled to provide sensible disturbances in a button or face of the mouse, or to sense applied force and produce an electrical signal therefrom. In yet another embodiment, a generator is coupled to the housing of a pager or cellular phone in a manner to flex the thin housing wall, such that the housing provides both an inaudible inertial stimulus, and an audibly projected tone for signaling the user, optionally with a strain sensing functionality.

A method of manufacture includes designing a flexible piezoelectric package having an active region with a two-dimensional shape matching one or more faces of a housing, and attaching the package to the housing such that the face or faces radiate audio and/or inertial vibration when the package is energized. A region of the package may also act as a control transducer when the housing is stressed.

BRIEF DESCRIPTION OF THE DRAWINGS

These and other features of the invention will be understood from the description below taken together with the drawings illustrating exemplary embodiments and illustrative applications of the present invention, wherein.

DETAILED DESCRIPTION

Figure 1:
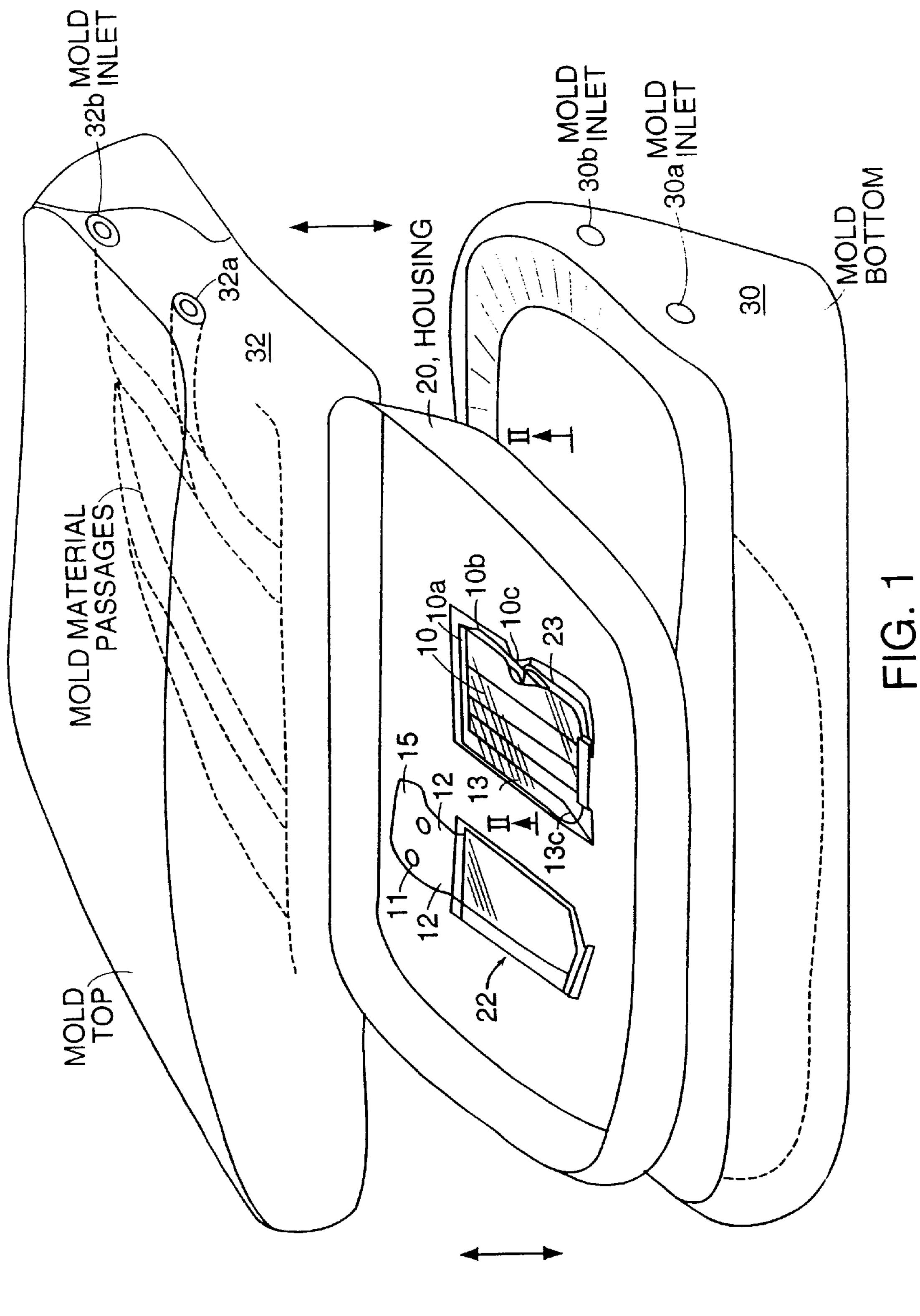
FIG. 1 shows one embodiment of a signal unit of the present invention and a method of its fabrication in a device.

As shown in FIG. 1, one embodiment of the signal unit of the present invention includes a signal actuator 10, which, together with its electrical connections, is mounted in a consumer electronic device, such as a cellular telephone, a beeper, a computer, or an accessory thereof. The signal actuator 10 in the illustrated embodiment has a generally sheet-like form, having approximately the dimensions of a credit card, and is itself assembled or formed with an upper ply or skin 10*a*, a middle layer 10*b*, and a lower ply or skin 10*c*. The middle layer 10*b* includes an electroactive material, such as a piezoceramic material which may, for example, be a piezo-fiber-filled composite material, a sintered piezoceramic sheet material, or other body of piezoelectric material with suitable actuation characteristics as discussed further below. In the illustrated embodiment, the signal actuator extends over an area, which as illustrated, is about the size of several postage stamps. As will be clear from the discussion of specific applications below, its size may range from several millimeters on a side, to several centimeters or more on each side, but the piezo material is in each case a relatively thin layer, under several millimeters and typically about a one eighth to one half millimeter thick. In some embodiments, the actuator is formed with several such sublayers of material laminated together to constitute the overall sheet actuator 10. For simplicity of discussion below, the electroactive material shall be simply referred to as piezoceramic material, since piezoceramic is readily available and possesses suitable actuation and mechanical properties.

Each of the outer layers 10*a*, 10*c* includes conductive traces or conductive material for establishing electrical contact with the piezoceramic material, and preferably also a continuous sealing layer such as an insulating support film or a thin metal shim, which in the latter case may be the conductive layer itself. One suitable construction for forming such a piezo area actuator is shown in commonly-owned U.S. Pat. No. 5,656,882, which is hereby incorporated herein by reference in its entirety. That patent describes a general technique for laminating conductive and sealing layers about one or more central layers of piezoelectric material to form a more rugged and free-standing assembly capable of repeated in-plane strain actuation and bimorph bending actuation. The actuator need not be a simple rectangle or convex shape, but may include a number of separate actuation regions, interconnected by inert portions of the flex circuit layers that position the regions in relation to each other and provide necessary electrical junctions. Such a shape is shown, for example in FIG. 6 of commonly-owned U.S. patent application Ser. No. 081760,607 filed on Dec. 4, 1996, wherein an F-shaped planar actuator assembly has two active cantilevered arms each containing electroactive material, and connected by intervening regions of flex circuit lamination that contain no fragile material and may be clamped to position the assembly or bent to align the unit before clamping. The Ser. No. 08/760,607 application is also hereby incorporated herein by reference in its entirety. The device illustrated therein also has other regions of its flexible sheet structure which further lack conductive traces and may be punched, drilled, cut or clamped as necessary to fit, align and hold the assembly without impairing its basic mechanical or electrical properties. The above-described actuator fabrication techniques are of broad generality, and may be applied to units wherein the active material comprises sintered piezoceramic sheets, piezopolymer layers, or constructions involving composite piezo material, such as piezo fibers, flakes or powders; these latter may, for example be arrayed to enhance the magnitude or directionality of actuation, or their overall control authority or strength.

In the present construction, the signal assembly is either preformed, for example by the aforesaid techniques, or else a partial piezo assembly is formed including at least one surface/elelectrode cover layer, and the partial actuator assembly is added to or completed by an injection molding, laminating or assembly process so that a polymer body or shell, e.g., the housing wall 20, constitutes a further covering, co-acting or enclosing layer. Furthermore, as discussed below in relation to some embodiments of the methods of this invention, one of the outermost layers may have a modulus or mechanical property effective to act against the strain of the piezo assembly and to form a monomorph or bender when integrated with the active signal assembly, so that when the electrodes are energized, bending occurs in the wall 20 and flexural or plate waves are formed. The invention also contemplates constructions wherein several piezoceramic layers are formed into a bimorph assembly, which by itself can be actuated to achieve plate deformations such as bending, and these are coupled into the wall.

Returning now to FIG. 1, as further shown in that Figure, outside of the region occupied by the piezoceramic member 10*b*, the module 10 possesses registration points, illustratively alignment holes 11 and notches 12, which by virtue of its sheet structure are simply formed by a stamping, punching or bulk milling process, or any of the patterning techniques common in circuit board fabrication or microlithography. The module 10 also includes electrical leads 13, visible through the outer film, which extend to connectors 13*a* such as pin socket ribbon cable connectors. Suitable methods of fabricating the module 10 are shown in the aforesaid commonly-owned U.S. Pat. No. 5,656,882 issued Aug. 12, 1997 of Kenneth B. Lazarus et al. That patent describes laminating techniques for forming a free-standing or self-supporting piezo element which is packaged into a card that provides strain actuation over its entire surface. Unlike, for example, arrays of ultrasound-emitting points, the overall construction is directed to a transducer wherein a broad surface region is to be strain-actuated all at once, and the techniques described therein were found to overcome problems of breakage and delamination in area-type thin sheets. The present invention further incorporates electroactive units in devices and assemblies to which the material is mechanically coupled with an effective inertial or acoustic coupling.

As mentioned above, the constructions of the present invention also include constructions involving bonding one or more electroactive layers to flex or sealing layers which may amount to a less complete package, in which one or more piezo layers are unitized or strengthened, and electroded, sufficiently to be handled, aligned and positioned, and the actuation sub-assembly is then assembled into a housing or sound board by being molded together with or laminated with the device, or into an assembly that is asymmetric about the neutral axis of the piezo layer(s), to provide bending beam, wall flexure or cantilever actuation as coupled to the housing. In this regard the invention also includes constructions in which a piezo bimorph is assembled, for example according to the teachings of the aforesaid patent, and is attached at one or more discrete points, bands or regions so that the bimorph moves and transfers impulses to its points of attachment or contact.

Relevant teachings for this aspect may also be found in the aforesaid commonly-owned and co-pending U.S. patent application Ser. No. 08/760,607 entitled Valve Assembly. That patent application shows representative geometries for providing a piezoelectric/flex circuit sheet assembly mounted as a cantilevered beam that moves a blocking member or mass suspended over a valve or flow opening in a device housing. In accordance with a further aspect of the present invention, discussed more fully below in connection with FIG. 3, by substituting a proof mass for the blocking member and driving the beam to oscillate, such an assembly forms an inertial signal generator.

Continuing with a description of FIG. 1, the housing 20 is illustrated as a thin-walled shell, such as may commonly be formed by injection molding of a thermoplastic material, a contoured box, can, shell or tray-like cover or curved enclosing surface. Examples of such housings or shells are, for example, cases of paging units or cellular telephones, cases of laptop computers, housings of computer mice or hand-held information indicating, switching, tuning or drawing devices, and those of hand-held or carried music playing, radio, or facsimile modem or communication devices. The illustrated shell 20 is substantially rectangular, and includes a first recess 22 and a second recess 23 into which are fitted respective modules 10. As shown in phantom for the left unit, a flex-circuit portion 15 of the module 10 extends as an alignment or positioning flap from the active central portion of the module 10. Flap 15 may be formed without the internal layer of piezo material, and it is used for mounting or temporarily positioning the assembly, with registration features 11,12. Each module 10 also contains a connector 13*a*, which may for example be a socket, edge connector, or stiff conductive land region, although as noted above several regions may be interconnected by flex conductors, in which case only a single socket is required to energize the distinct regions of piezo material.

Figure 15:
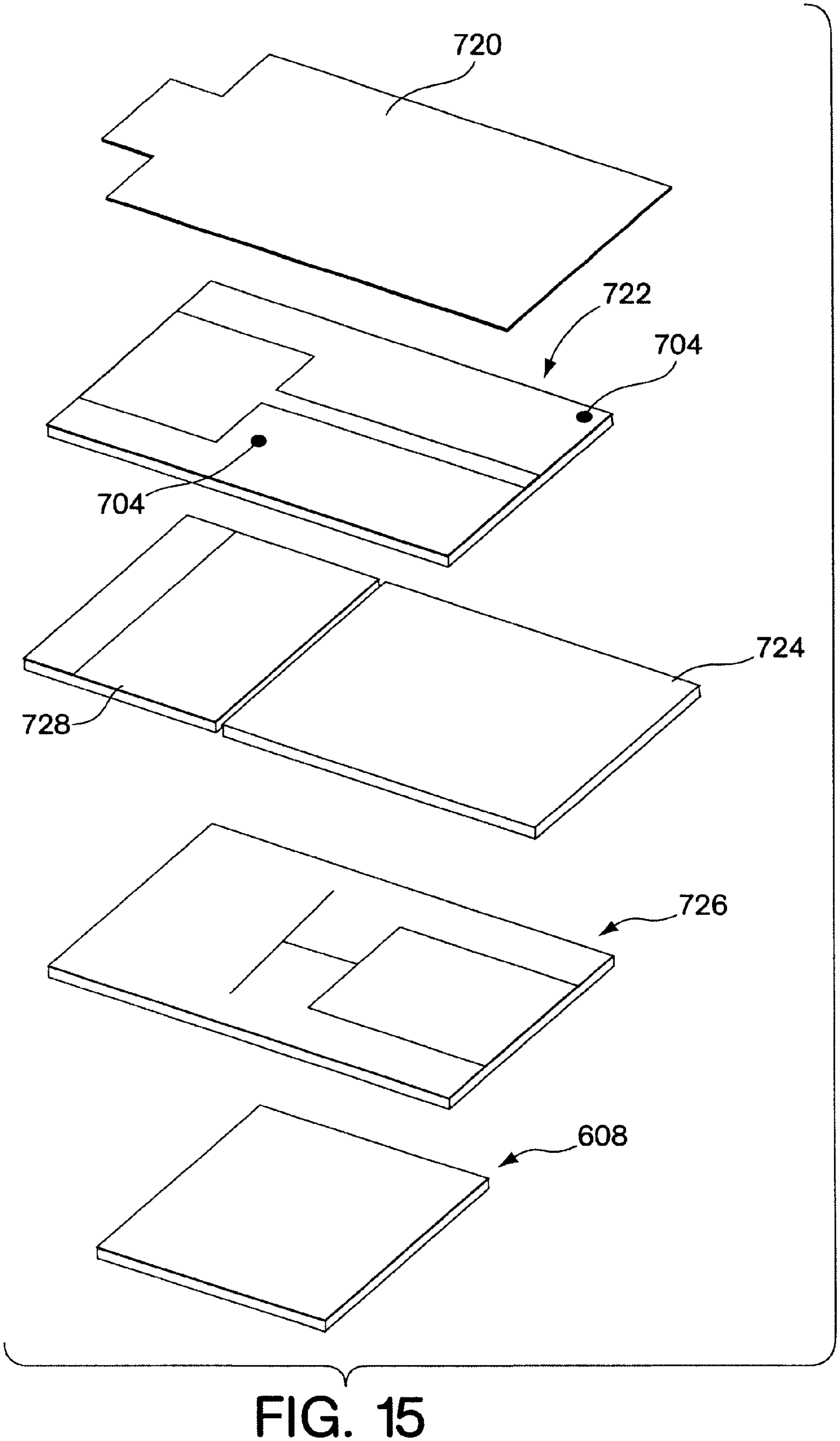
FIG. 15 shows an embodiment of the invention having an electrical connection pad.

As shown in FIG. 15, in one embodiment of the invention, a device comprises an coverlay 720 made of, for example, polyester; an electrical connection pad 722 made of, for example, an FR-4 board; an electro-active element 728; a spacer 724 made of, for example, brass, steel, or a polysulphone; a single-sided flex circuit 726; and a mass 608. The electrical connection pad 722 may be exposed through the coverlay 720 and may further comprise at least two through-holes 704, which can be, for example, plated, or ink-through holes. The through-holes 704 can be used, in combination with a conductive spacer 724, to establish electrical contact with both sides of the electro-active element 728, in that the first through-hole can be used to establish direct electrical contact with the electro-active element 728 and the second through-hole can be used to establish electrical contact with the conductive spacer which is, in turn, in electrical contact with the single sided flex circuit, which is, in finally, in electrical contact with the electro-active element. Thus, with such a construction, both electrical connections can be made through the same surface of the device. The exposed electrical connection pad 722 are especially useful with an elastomeric or zero-insertion-force connector or connection scheme.

Returning to the schematic exploded view of FIG. 1, the module 10 and housing 20 are preferably mechanically interconnected by being formed together during manufacture, for example by a molding process such as injection molding together between portions 30, 32 of an injection molding die. In this method of fabrication, the module 10, including piezo material and at least one lamination of the electrode/strengthening material is positioned and aligned in the cavity of the mold die, for example, by being placed in a recess in one side of the multi-part die assembly, or held by pegs projecting from the wall of the mold cavity. The housing shell 20 is then formed about or against the module 10 by injecting a fluid or plastic polymer material through one or more die inlets 30*a*, 30*b*, 32*a*, 32*b* which open into the cavity. Preferably, one wall of the cavity provides support for the module 10 during fabrication, especially when the fabrication is performed by a high pressure injection process. In the illustrated embodiment, the modules 10 may be supported in half-height recesses in the upper die body, so that the plastic mold material covers at least one face and in the finished assembly the modules are partially or entirely embedded, e.g., for half their height, in the surface of the housing 20. The recess thus positions and aligns the module 10. Furthermore, the extent to which the module projects from the die and is thus recessed into the molded wall of the housing results in a corresponding thinning of the adjacent region of the housing wall, rendering it more suitable for vibrational actuation. In this case, the presence of the module contributes to strength of the housing wall while allowing it to enjoy better acoustical transmission.

In a representative embodiment for actuation as an audio speaker, modules 10 having a size of approximately one by three inches formed about a single seven mil thick layer of PZT (lead zirconium titanate) piezo material were employed, encasing the piezo within flex circuit material as described in the above-referenced '882 patent, and attached to housing 20 having an overall wall thickness of approximately one half to two millimeters. The polymer constituting the housing wall is substantially less stiff than the unit 10, which, because of its small thickness dimension, produces a significant strain only along its in-plane axes. Since the surface of module 10 was continuously joined to the adjacent polymer material of the wall, actuation of the piezo produced substantial flexural excitation of the housing itself, causing the housing to act as a speaker and permitting its use for audio sound production. In an exemplary embodiment of this type, the device has an acoustic radiating resonance of an audible voice of between about 300 Hz to about 4 kHz.

Figure 1A:
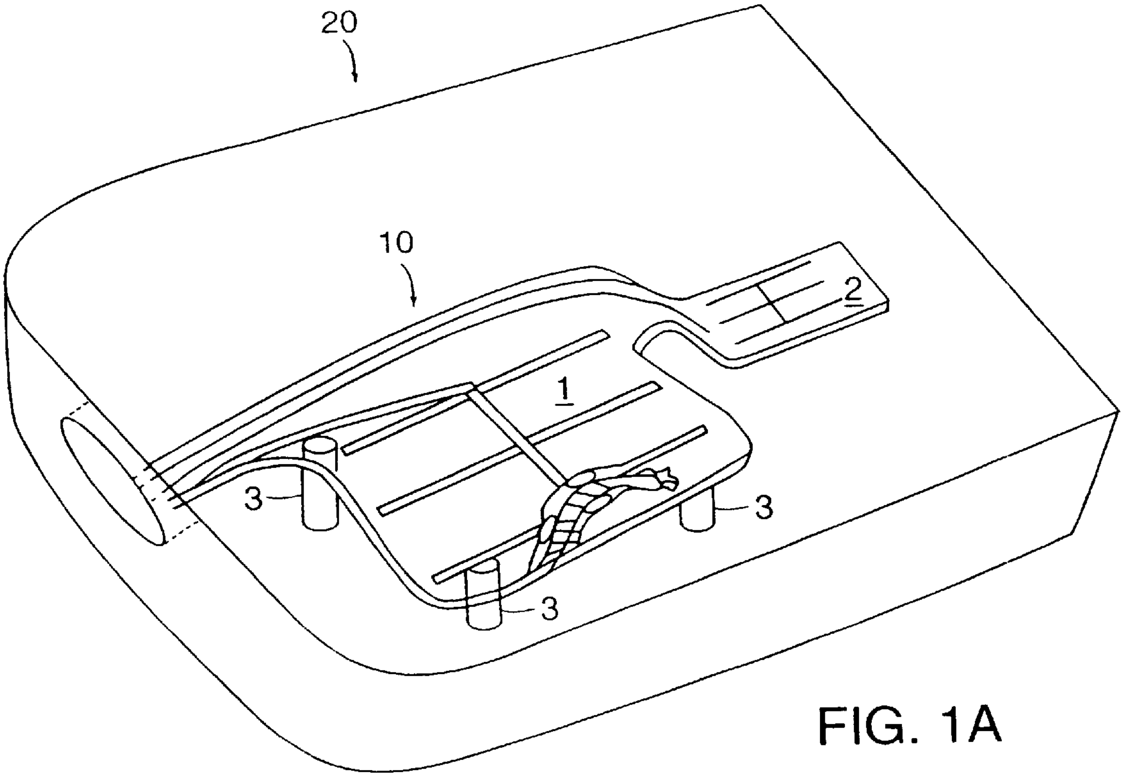
FIG. 1A shows another embodiment having separate transducer regions of different type.

FIG. 1A shows another embodiment wherein an active signal generation module 10 is mechanically in contact with a housing 20. In this embodiment, the module 10 has a first portion 1 and a second portion 2 each disposed in a different region of the sheet. Portion 1 is mounted so that its sheet structure is attached at discrete points, illustratively on posts or stand-offs 3 extending from the housing 20, while portion 2 has its full face affixed to the wall of the housing, in a construction similar to that of FIG. 1.

Figure 2:
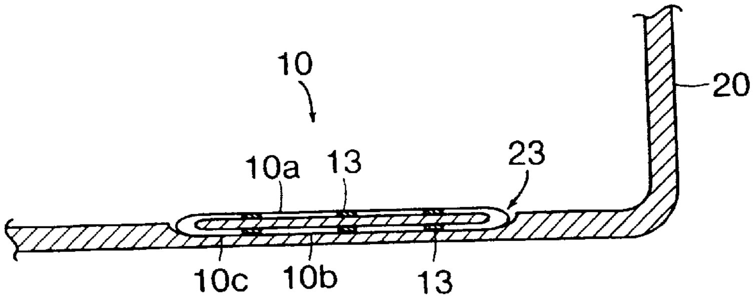
FIG. 2 illustrates details thereof.

FIG. 2 shows a partial section through the signal generator of FIG. 1 or the region 2 of the device of FIG. 1A, illustrating one aspect of this construction. As shown, the piezo material covers a region of the wall, and is located asymmetrically toward one side of the wall, i.e., is attached at the inside surface of the wall. Furthermore the wall thickness is preferably somewhat greater than the thickness of the piezo material as shown, but is nonetheless sufficiently thin so that it is effectively flexed or vibrated by the actuator. In fact, optimal SPL performance is achieved by maintaining the relative thinness of the overall device. SPL is roughly proportional to deflection which, in turn, is proportional to induced curvature. Curvature is expressed as moment over bending stiffness. Thus, decreasing device thickness increases curvature, and subsequently SPL. In general, when a piezoceramic is used and a polymeric housing is employed, the wall will be appreciably less stiff than the actuation material of the signal generator.

In the above-mentioned commonly owned patents and patent applications, the use of relatively stiff and strong flex circuit materials, such as polyimide, polyester or polyamide-imide materials is preferred for making free standing piezo actuators. In the present construction, however, materials constraints may be relaxed since the assembly is to be supported by the device housing. In the construction of FIGS. 1–2, for example, once the assembly is attached to the wall 20, the wall itself will normally be effective to limit deflection of the material to below its breaking limit. Preferably for audio actuation a thin piezo layer is used, about one to three tenths of a millimeter thick, and the housing or device wall that it actuates is a wall about one to three times this thickness. Overall, the wall thickness is kept small, but its area is relatively large, so as to effectively couple vibration and transmit sound into air, or, in the case of a sub-audible signal, is sufficiently big to provide a touch-sensible flexing region.

Another consideration in the overall construction is to obtain a sufficiently strong level of adhesion between the actuator and the wall. When the actuator is to be separately cemented onto a pre-formed housing, this is achieved by using an adhesive that is compatible with the surface materials of the housing and actuator, and clamping the broad faces against each other. When assembly is performed by molding the housing about the actuator sheet or with one surface entirely in contact with the actuator sheet as discussed above, then effective mechanical continuity can be achieved, even when using a stiff smooth surface layer such as a polyimide flex circuit material for the actuator, by first coating the outer surface of the actuator with an adhesive that is compatible with both the circuit layer and the injected plastic material, and then molding the housing in contact with the coated piezo assembly so that both are secured together. In one prototype of a unit as shown in FIG. 1, the piezo material was formed into an electroded actuable unit using a polyester film cover layer, and a one mil thick sheet of adhesive was placed over the polyester which was then positioned in the injection mold. Integration with the housing was effected by injection molding of a heated polycarbonate plastic matrix at several thousand psi pressure while the piezo assembly was fitted in the face of the injection molding cavity. Other thermoplastics, as well as materials such as rubber, curable polyimide, epoxy or curable liquids may be used to good effect, and the use of fluid or less viscous materials may be effective for low pressure forming, such as casting techniques. Also, when a relatively penetrating curable liquid is used, the construction may eliminate certain electrode, enclosing layers, or adhesive layers from the sheet actuator assembly, and achieve sufficient strength and conductivity with metallized piezo elements embedded in the cured molding or casting. When the matrix material cures by cross linking or drying, this effect may also serve to place the piezo material under compressive stress and enhance its longevity and elastic actuation characteristics. The invention also contemplates constructions wherein the housing is formed by a process of laying-up a composite fiber/binder shell, such as a glass-epoxy or graphite-binder lamination procedure, to form a wall structure in which one or mores modules are sealed within, partly embedded, or surface-attached to, the composite body.

A further desirable structural arrangement achieved with the construction of FIG. 2 is that by placing the module 10 in a construction wherein its full face, or a full region of a portion of a face, is affixed over a continuous area of the housing, the actuation of the module can produce inplane strain wherein relatively large displacements are developed over its extent and a monomorphic bending action, or flexural excitation, of the housing wall is achieved. This allows the construction, when actuated at a low frequency, to form a silent but tactile actuation of the housing, with an effect similar to that of the conventional imbalanced rotor signal units of the prior art.

Figure 2A:
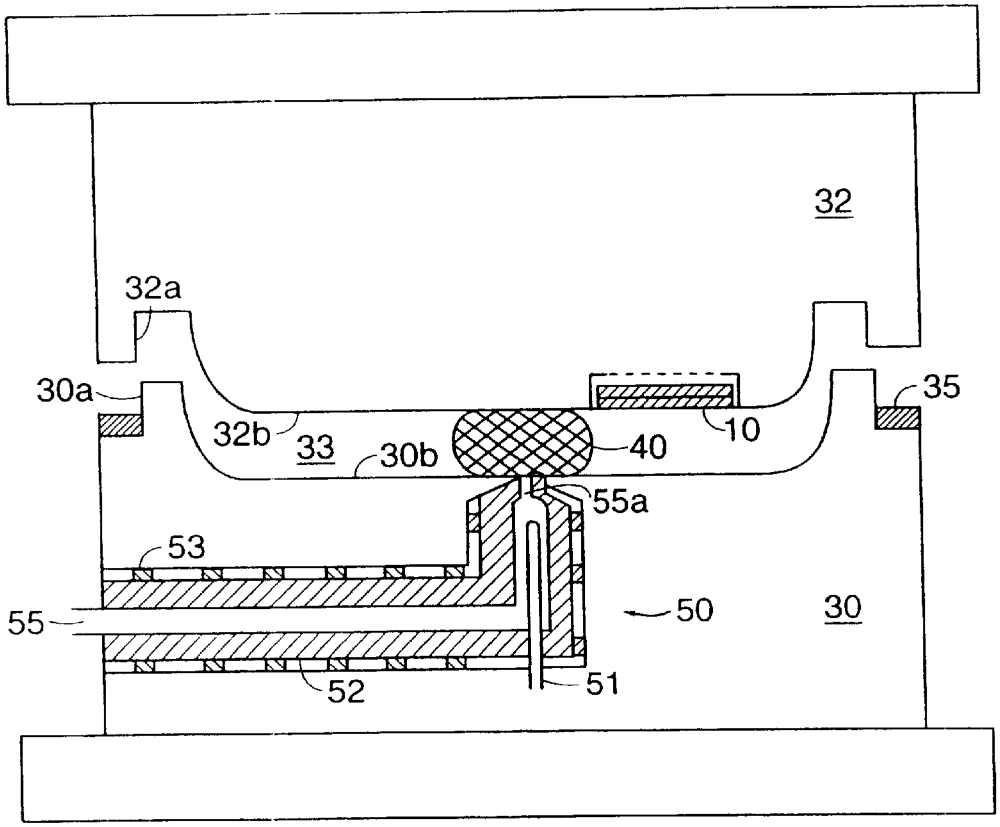
FIG. 2A illustrates details of a manufacturing mold and fabrication steps.

When forming the device by injection molding at elevated pressure and temperature, the mold is preferably operated to avoid excessive force on the piezo, and to avoid subjecting the piezo to excessive heat. FIG. 2A shows in cross section this fabrication method. Mold forms 30, 32 are brought together to define a mold cavity 33 between opposed faces 30*b*, 32*b*, and a mass of forming material 40 is introduced into the cavity to fill the available space. The mold body is configured so that one surface 30*a*, 32*a* of each half fits tightly against the other, and seals, so that the cavity is closed and the material 40 assumes the thin extended contoured shape of the remaining space in the mold cavity. The actuator assembly is fitted into a recess 32*c* in the surface 32*b* so that it is out of the turbulent injection flow path and is closely and uniformly supported against surface pressure. In the illustrated mold assembly, a material inlet 50 includes an inner material passage 55 controlled by a valve 51 to selectively open an outlet orifice 55*a* of a supply conduit 52 that opens to the interior of the cavity. A heater 53 surrounds the conduit 52 and maintains the plastic material at a temperature to keep it sufficiently fluid at the flow pressure involved, which may, for example be several thousand psi. Preferably, however, the mold itself resides and is maintained at a low temperature which is, for example, below the Curie temperature of the electroactive material. Thus, in a molding process where the temperature of the matrix is raised to form its shape, the recess 32*c* forms both a mechanical support and a thermally protective sink for the assembly 10. Using such an arrangement, a polycarbonate material may be dependably injection molded at a temperature of about 300° F. at pressures of 13.5–15 Kpsi without damaging the piezo material.

In the mold assembly illustrated in FIG. 2A, a single orifice 55*a* is shown. It will be understood, however, that multiple material inlets may be provided, as well as one or more closable sprues or vents, to assure complete filling of the cavity. Overall, the mold may be configured to quickly fill and quickly cool down the injected material, so that the electroactive material does not experience the high initial temperature of the injection melt. Preferably, the material inlets and vents or outlets are arranged so that the moving flow of material acts only against a fully supported actuator sheet, thus minimizing the possibility of breakage. For this purpose, the recess 32*c* can be quite shallow, or may be absent altogether. In the absence of a mold face recess, the partially assembled module 10 can be temporarily held in position in the cavity by retractible or fixed alignment pins or by a spot of contact adhesive, or by any other suitable means.

In other embodiments, the module 10 may be fastened to the housing by the flap portion 15, while the active signal portion is attached—e.g., cemented or injection molded—to a separate element such as a circuit board, or to a diaphragm or horn which improves the efficiency of sound signal radiation.

The use of a thin layer of piezo material allows the material to be actuated and change state at relatively high frequency, namely in the audio band, despite its capacitive nature, while using relatively low drive voltages. When driven at lower frequencies, under several hundred Hz and, in a, beeper preferably at resonance (about one hundred ninety Hz in one device), the actuator produces an easily felt but substantially inaudible flexural or vibratory movement which is referred to herein as an "inertial" signal. Driving in this manner produces a substantially elastic disturbance of the signal unit and/or housing, and thus may be resonantly driven using relatively little power. The module may produce signals such as a tone or a buzz, which are generated at audio or lower frequency and are electrically synthesized signals.

One form of signal, which is both inertial and non-audio, is obtained by producing a vibration of the wall that because of its low amplitude and/or form of vibration does not radiate sound, or radiates only a low buzz or murmur. This excitation, which corresponds very closely to that conventionally produced in a paging device by means of an imbalanced electromagnetic motor, is achieved in accordance with one aspect of the invention by providing a signal-producing piezo package as described above and attaching the package to the housing such that a portion of the package area undergoes an actual displacement, such as a oscillating bending motion, while another portion of the package is clamped, pinned or otherwise attached at an end or inner portion thereof to the housing so that the inertial imbalance of the moving package is transmitted into the housing as vibrational energy.

Figure 3:
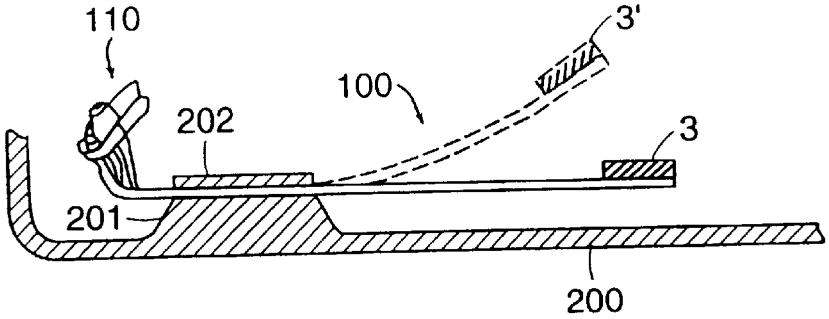
FIG. 3 illustrates an inertial or audio embodiment of the signal unit of the invention.

FIG. 3 illustrates such an embodiment. As shown in that figure, a housing 200, such as the housing of a beeper or the like, has a module or signal unit 100 mounted thereon with a part of the unit fixedly clamped between a pedestal 201 and cap 202 so that it is cantilevered over the housing floor. A ribbon-like flex circuit extends to a power connector 110 to energize the active portion of the unit 100, which is fabricated as a bimorph, or as a piezo/metal shim monomorph, so that it bends like a diving board and oscillates about its clamped end. A mass 3 is preferably mounted at the moving end of the signal unit 100 to accentuate the imbalance. Generally, devices of the invention may be "mass-loaded" in order to alter or control the vibration level and frequency of the signal unit. The entire unit may be driven in resonant oscillation so that the inertial imbalance transfers a relatively large amplitude periodically varying force to the pedestal 201 and creates an inertial vibration in the housing. The dimensions and stiffness of the sheet construction may be selected so that the unit 100 resonates and little power is required to initiate or maintain its oscillation.

In one particular mass-loaded embodiment of the invention, a signal alert device is configured as a bimorph bender, and comprises a metal center circuit and metal spacer. The electro-active elements are 0.6 inches wide by 0.5 inches long and 0.0075 inches thick. The electro-active elements are not electroded under the clamp, such that 0.25 inches of the electro-active element is active. Each of the benders has a 2.2 gram mass mounted to the tip to bring the resonant frequency to about 105 hz.

As described in the above-referenced patents and applications, circuit elements forming an R-C or RLC circuit may be incorporated in the planar sheet construction. In addition, the electrode connection portions of the sheet element may also carry other circuit elements, including non-planar elements which are attached following the basic sheet assembly. These elements may include audio amplifier, voice or sound generator, or filter/signal processing chips connected and configured to adapt one or more portions of the unit 100 to emit audio sound, or to sense audio or tactile signals.

Such additional circuit elements are advantageously used in the device of FIG. 1A, a plan view from above of a signal unit incorporating both audio and inertial generation portions. As shown, the unit includes a sheet-like packaged piezo assembly in which the first active piezo area 1 and the second active piezo area 2 both extend in a common sheet, with flexible packaging or circuit portions that may allow a common connector to energize both portions while separately positioning each for cementing, injection molding or other form of attachment in the device. The portions are separated by flexible bands of interconnecting material, and each may be separately actuated essentially without introducing cross-talk in the other. Either portion may be set up as a cantilever beam, bender, free-space vibrational source, or audio vibration or inertial bender plate fully affixed to the wall.

Figure 3A:
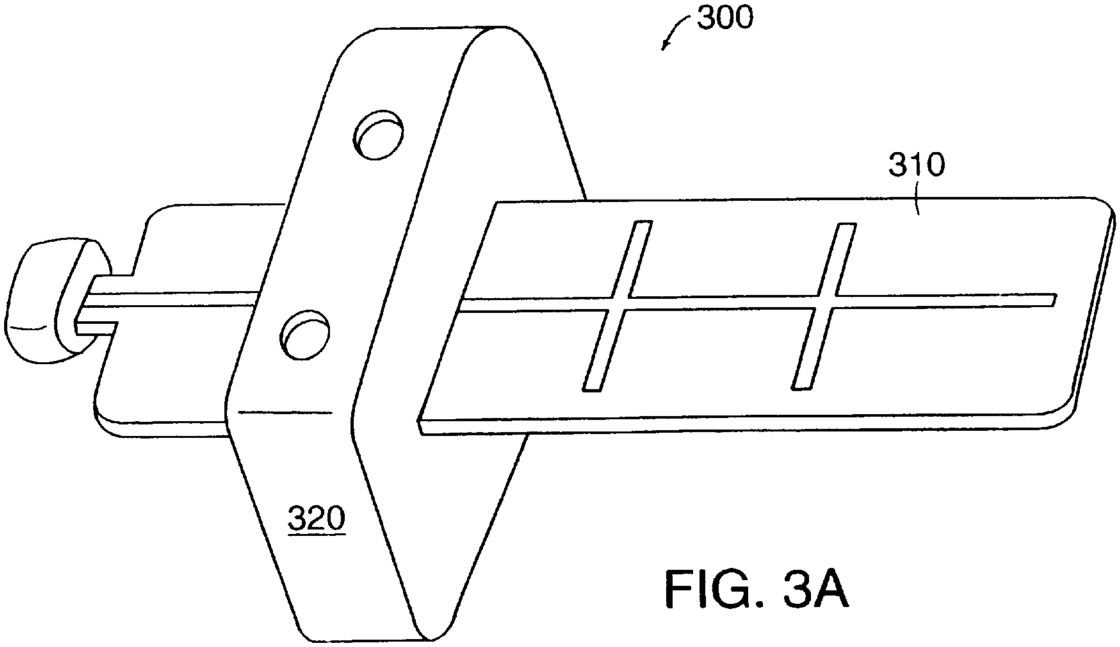
FIG. 3A illustrates another inertial or audio embodiment formed as a hybrid sub-assembly.

FIG. 3A shows another embodiment 300 of the invention. Unit 300 is a hybrid actuator assembly adapted for simple mechanical attachment to diverse user devices. As shown, the unit 300 has an actuator sheet portion 310 which may be a vibrator, monomorph or bimorph bender or other thin sheet area piezo actuator device as described above, and a body 320. Body 320 may be a block, as shown, which may for example include or accommodate bolt holes for conventional attachment to a wall or housing, and may be formed by molding, casting or cementing about the sheet portion 310. Body 320 may alternatively be a more complex shape, such as an L-bracket, multi-post standoff, horn, or other shape specifically adapted to mounting in a specific housing or audio system.

Figure 3B:
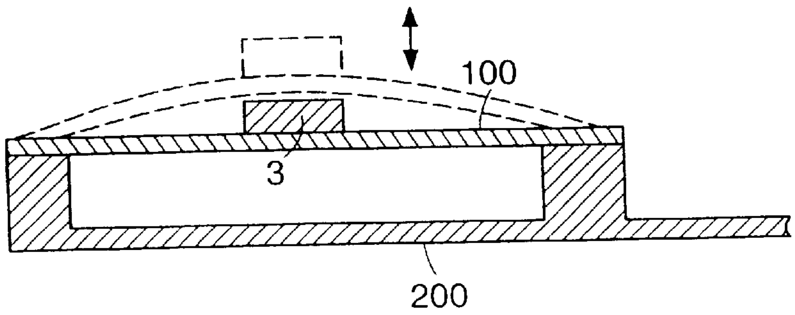
FIGS. 3B–3D illustrate further embodiments useful for inertial and other signal generation systems.
Figure 3C:
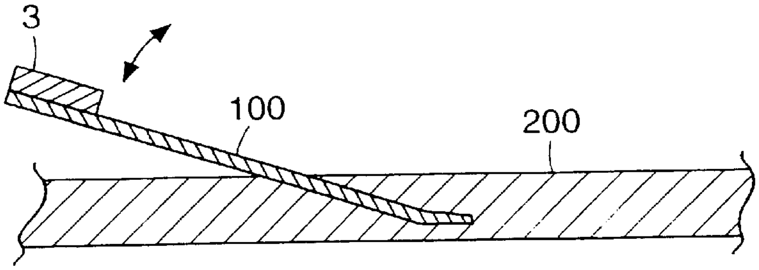

FIGS. 3B and 3C show further mechanically useful embodiments wherein a polymeric housing or wall 200 is attached to an electroactive module 100 of the present invention. Also shown is a weight or mass 3 carried on the module 100 to increase its inertia. These embodiments are advantageously applied to create inertial impulses and couple them into the wall. The embodiment of FIG. 3B may also be constructed without the weight 3 so as to constitute a lighter structure, which may, for example, function as a direct-to-air sound emitter, or which may be configured to reinforce or amplify the level of vibration induced in or coupled to the housing wall through the solid support. While these two Figures show a pinned-pinned or boundary-clamped module mounting (FIG. 3B),and a pinned or clamped end module (FIG. 3C), the invention contemplates structures wherein the module is mechanically coupled to the housing by other appropriate mechanical arrangements of clamp, pin, bias contact or partially free configurations to allow the module to both generate the desired mechanical action and couple it to the housing. The invention further contemplates other constructions employing a module 10 as described herein, which extend or improve the art.

Figure 3D:
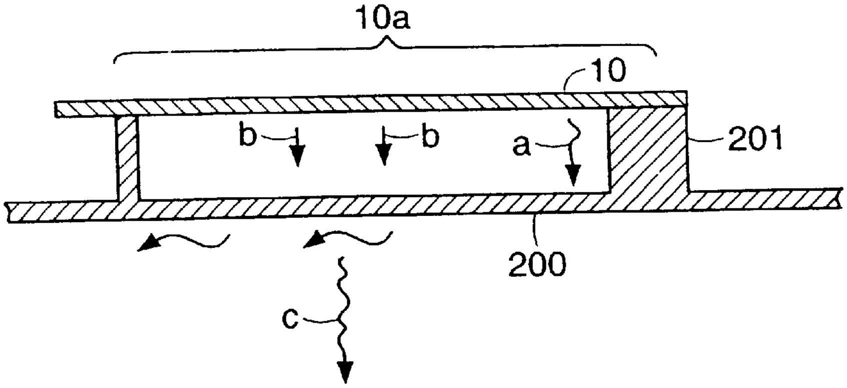

Thus, FIG. 3D shows a construction wherein a module 10 as described above is attached to a wall 200 through a support rim or discrete supports 201, which as shown are place at edges of an active region 10*a* of the module 10. The structure is assembled such that the wall receives energy by direct vibrational coupling through the support 201 (indicated by way arrow "a") as well as energy coupled through the atmosphere (e.g., sound, indicated by straight arrows "b"). The housing thus produces signals (denoted by arrows "c") at its surface. The assembly may be tuned for a coupled resonance of the emitting region of the wall, or may employ a perforated region such that, for example the "b" energy is radiated through as an audio while the "a" energy is applied as a tactile signal actuation of the wall. Because the module 10 contains a region of material which is actuated in bulk, the size or dimensions of the housing or attachment region may be varied arbitrarily while still employing the same module for all applications. Thus, for example, the assembly of FIG. 3D may employ the same module 10 when the supports 201 are to be spaced two centimeters apart, or three centimeters apart. This feature allows great leeway in implementing actuator housings wherein, for example, a portion of the wall 200 is required to have a particular thickness, and yet to also flex or to resonate at a particular frequency, since it is no longer to design the wall to fit the mounting and actuation parameters of a fixed driver such as a speaker. Instead, one may simply determine the required wall properties, for example so that it has a response at the desired signal (e.g., a 100 Hz flexural resonance, or an audio response to vibrational stimulation) and the module is attached so that it is dynamically coupled to the shell to amplify or enhance the response of the shell.

Figure 4:
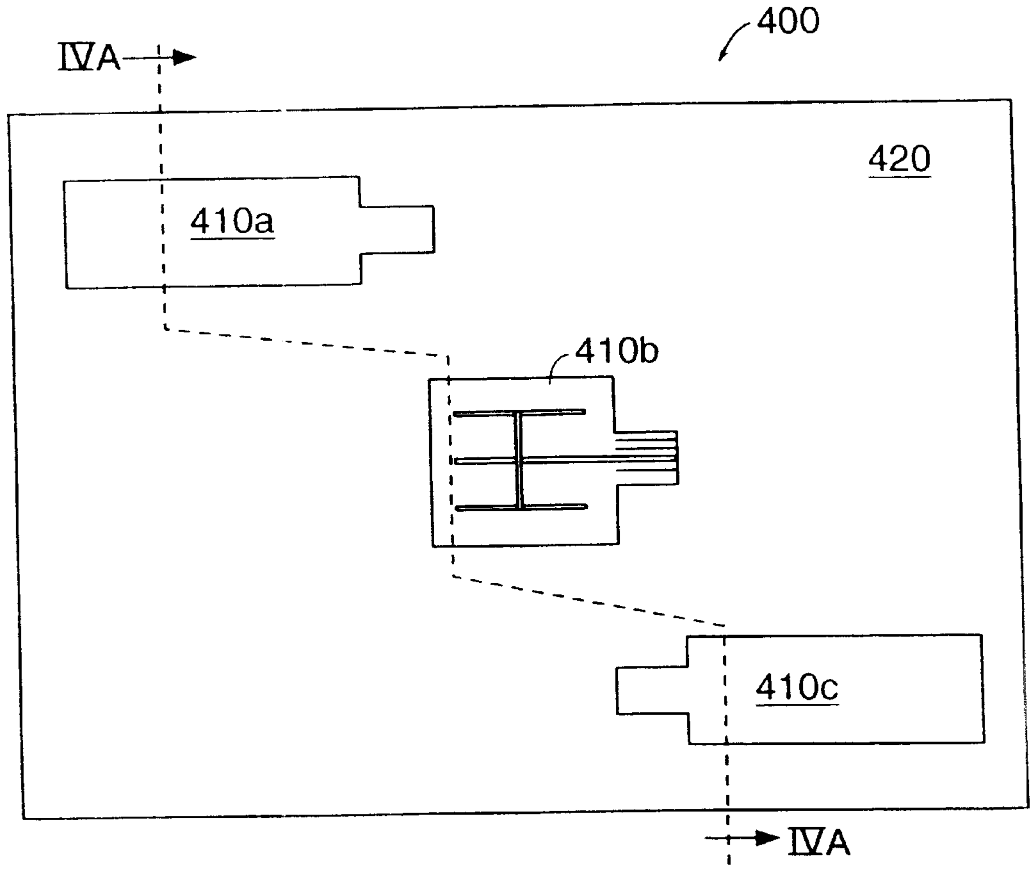
FIGS. 4 and 4A another embodiment useful for stereo audio systems.
Figure 4A:
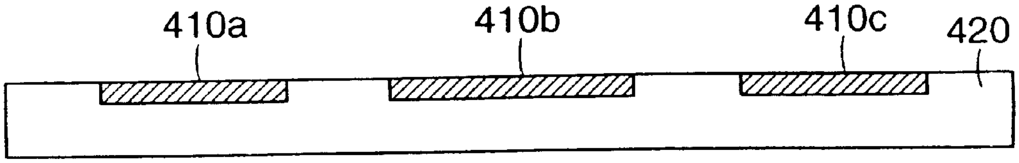

FIGS. 4 and 4A show top and sectional views of yet another embodiment 400 of the invention. In this embodiment, several separate electroactive units 410*a*, 410*b* and 410*c* are each affixed in a common wall 420. One is centrally positioned to actuate the panel as a whole to, for example, radiate longer wavelength acoustic energy, while two other actuators are positioned diametrically apart to provide separate emission regions which may for example be used for stereo speakers at higher or more directional frequencies. These actuator units may be positioned in other locations as desired, for example to connect with specific circuitry in the intended device, or located to avoid nodal or resonant positions of the wall, by suitable design of the mold cavity or assembly fixtures. In addition to actuation as audio or non-audio generators, the actuators may be used for sensing and user feedback. In this case, the described sheet structure may be embedded more deeply in the wall so that only a thin, flexible membrane-like portion of the wall covers the actuator and the user's touch transmits strain into the sheet for forming a signal. When used as a sensor, materials with less stiffness, strength and/or control authority, such as flexible PVDF film or composite, may be employed in forming the module 10.

Figure 5A:
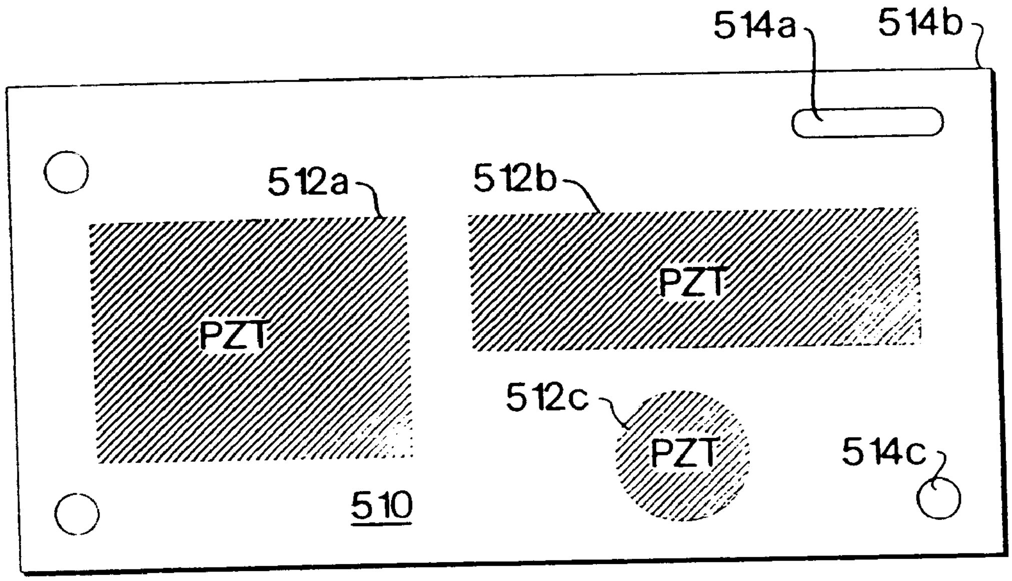
FIGS. 5A and 5B show further embodiments.
Figure 5B:
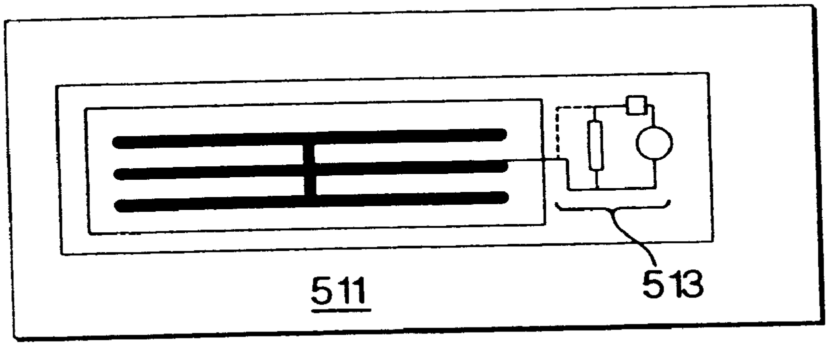

The invention is also adapted to provide manufacturing efficiency for the incorporation of multiple different functional drivers within a single device. This is done as indicated by FIG. 5A, by providing a multipurpose actuator unit 510 which is fabricated as a sheet structure in the manner indicated above, and has both a plurality of active regions 512*a*, 512*b*, 512*c* and its connecting or alignment features, such as edges, fastening holes and the like 514*a*, 514*b*, 514*c* positioned to fasten in a single step to a housing and thus to provide a plurality of possibly different inertial, audio or sensing control devices therein. One or more of the active regions 512 may be fabricated with a closely spaced set of circuit elements 513 as shown in active region 511 of FIG. 5B.

Furthermore, because the actuator itself may be readily manufactured in large sheets containing multiple separate units, and, as described in the foregoing patents, these may be shaped and configured in part by lithographic (e.g., electrode pattern-forming) and lamination techniques, the size and shape of the modules 10 is readily adapted to each required application while keeping unit design and manufacturing costs reasonable.

FIGS. 6A–6L illustrate representative examples of embodiments of the invention configured as audio, signal or sensing units in a variety of consumer electronic devices. In these figures, a sound-emitter is indicated pictorially by a small triangle, while a star is used as a legend to illustrate a suitable region of the housing for a vibratory or inertial transducer. The latter may also be used for sensing pressure or contact feedback from the user, which is preferred in some applications noted below.

Figure 6B:
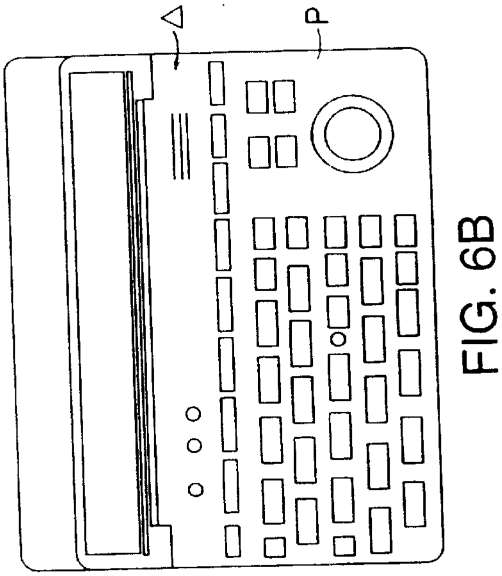
FIGS. 6A–6L show representative embodiments in consumer electronic devices.
Figure 6C:
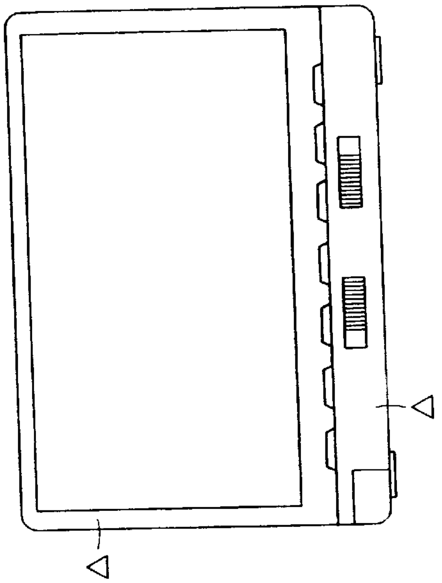
Figure 6A:
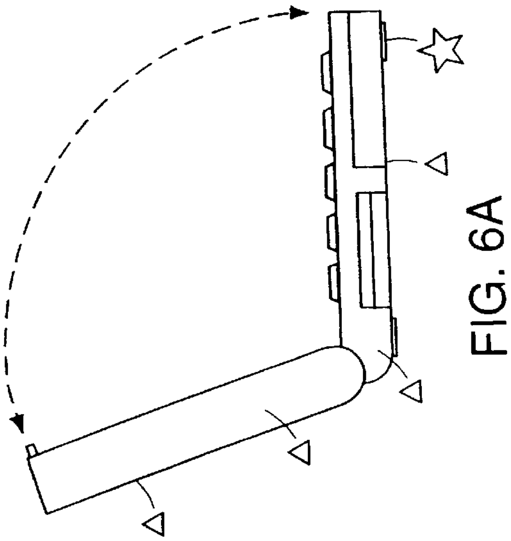
Figure 6D:
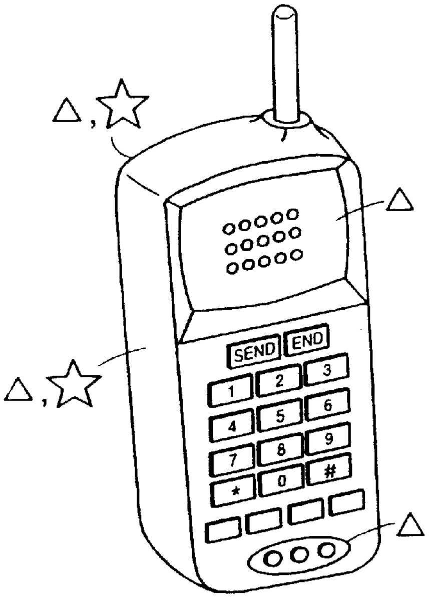
Figure 6E:
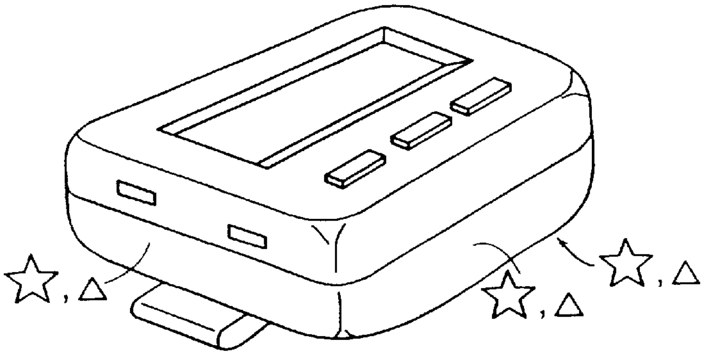
Figure 6F:
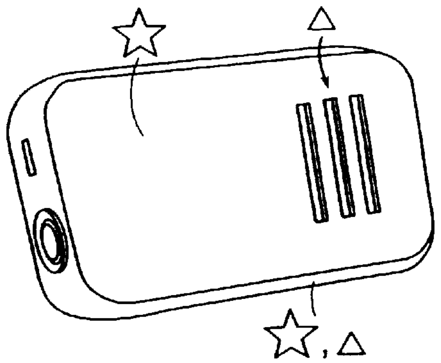
Figure 6G:
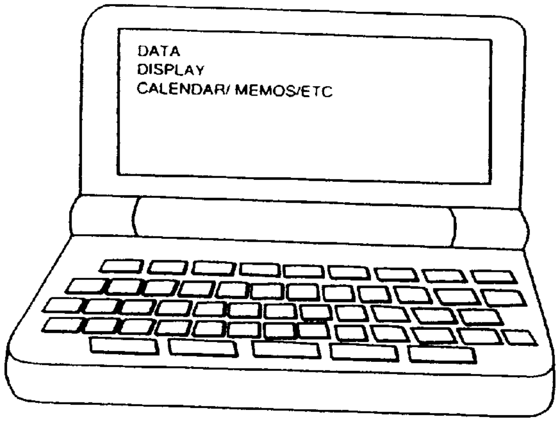
Figure 6H:
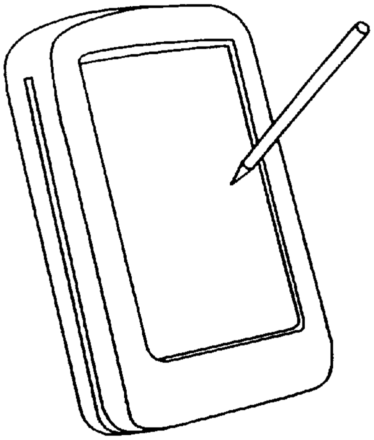

As shown in FIGS. 6A–6C, in a laptop computer, not only the broad panels of the device—such as the cover—may be used, but sound generators may be positioned to radiate at the sides or floor of the case, or around the edge of the keyboard or display. Some suitable positions for inertial signal units include the feet, bottom sides and the palm rest area P. Similarly, in a cellular telephone, as shown in FIG. 6D, not only may the ear and voice regions be implemented with modules of the present invention, but even faces of the housing such as the side or back may be fitted with any of the forms of signal transducer described above. For small units such as pagers (FIG. 6E) or beepers (FIG. 6F) all three type of signals may be conveniently positioned on the housing. The construction is particularly advantageous in efficiently producing inertial signals at a body-contact region of a small housing such as the belt clip area of a pager, or the edge or face of a beeper. For items such as a PDA (personal digital assistant) as shown in FIGS. 6G and 6H, the signal units may be positioned as described above for laptop computers. Here again, the scalability and lithographic manufacturing techniques of the present invention make the modules 10 especially advantageous.

Figure 7:
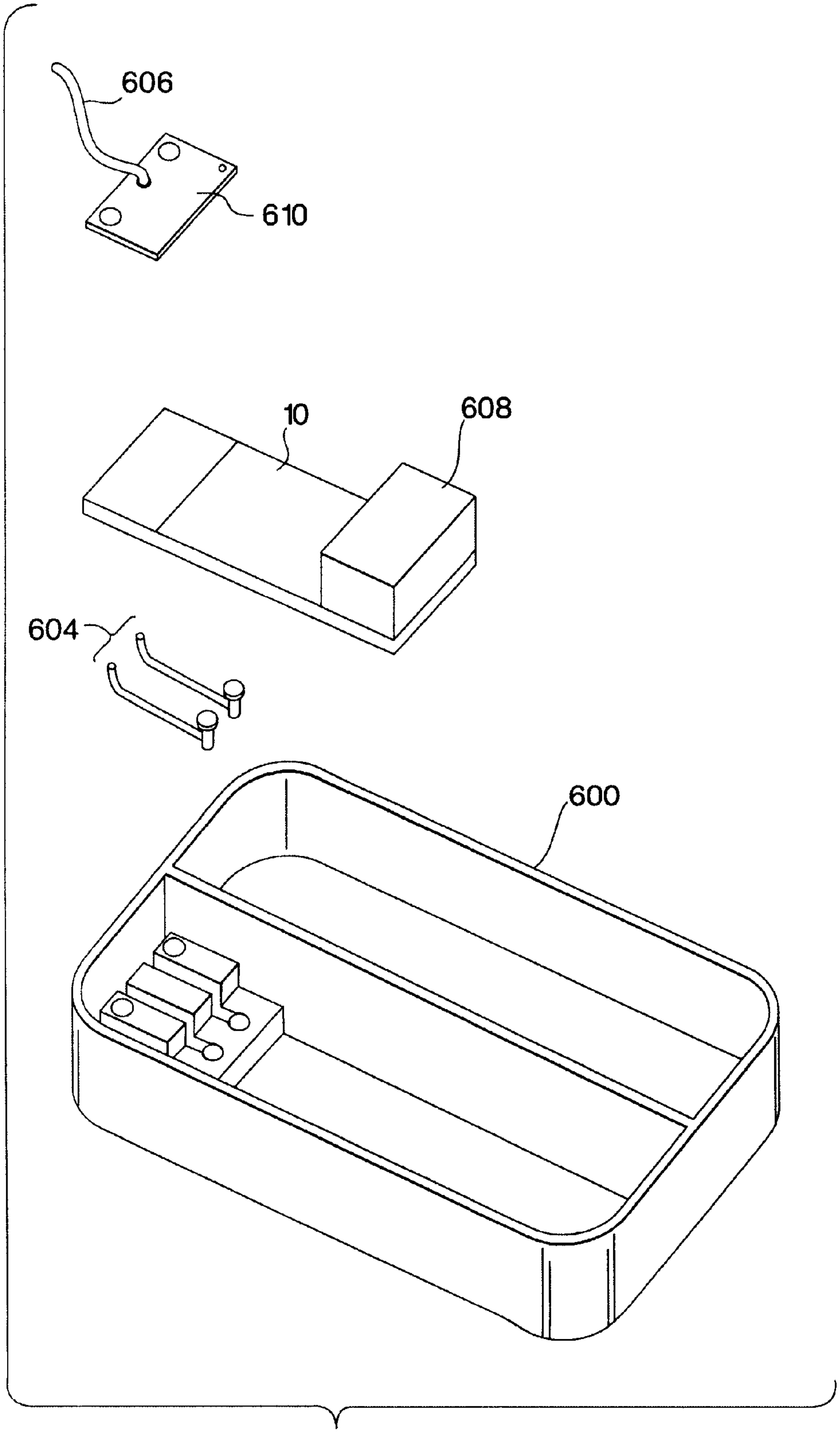
FIG. 7 shows an embodiment of the invention which is a mass-loaded pager.

As shown in FIG. 7, in one embodiment of the invention, a signal alert device, such as a pager comprises a housing 600, a signal actuator 10 comprising an electro-active element, and a conductor 604, an electrical contact 606, and a clamp 610. As shown, the signal actuator 10 may have attached a mass 608 to lower resonance vibration. In an exemplary embodiment, the device has a fundamental resonance of about 100 Hz and an acoustic radiating resonance of between about 3 kHz and 4 kHz.

When assembled, the device shown in FIG. 7 has a cavity defined by the space between the housing 600 and the signal actuator 10. Maintaining a tight tolerance between the housing 600 and the signal actuator 10 improves the acoustical quality of a device according to the invention. For example, a tight tolerance between the housing 600 and the signal actuator 10 improves the efficiency of the device, making an audible signal louder at a given excitation voltage. The volume of the audible signal may be altered such that the signal is detectable by the user at a distance from about 0 centimeters to greater than about 30 centimeters, for example. An exemplary width for the cavity between the housing 600 and the signal actuator 10 is between 0.004 inches and 0.10 inches.

The effect of a tight tolerance between the housing wall and the signal actuator may also be established through the use of a collar surrounding the signal unit or lining the housing wall. Alternatively, a tight tolerance may be established using any other mechanical constraint on the signal unit including, for example, injection molding of a polymer in the cavity between the housing and the signal unit, or one or more springs, gaskets, or dampers positioned within the cavity, or connected to the housing and/or the signal unit.

In yet another embodiment of the invention, a signal alert device is configured to radiate sound similarly to a piston, or a monopole, by maintaining a tight tolerance between the housing and the signal unit. Typically, a monopole configuration has greater broad band acoustic radiating efficiency than a dipole configuration. In general, sound radiation properties for comparison of devices of this invention can be tested as follows:

(1) positioning an embodiment of the invention at a known distance from a microphone;

(2) driving the actuator with a function generator and QP amp;

(3) sweeping through the frequency range from 2 kHz to 4 kHz to find a suitable acoustic resonance;

(4) adjusting the driving voltage until the actuator meets 80 dB at 12 inches, or 92 dB at 3 inches at a specific frequency or across a band of frequencies;

(5) recording the driving voltage and frequency of the actuator at the performance level;

(6) capturing voltage and current waveforms using a data storing oscilloscope to compute real power draw and to compare to predictions; and (6) measuring the capacitance at the acoustic resonant frequency using an impedance analyzer.

Figure 8:
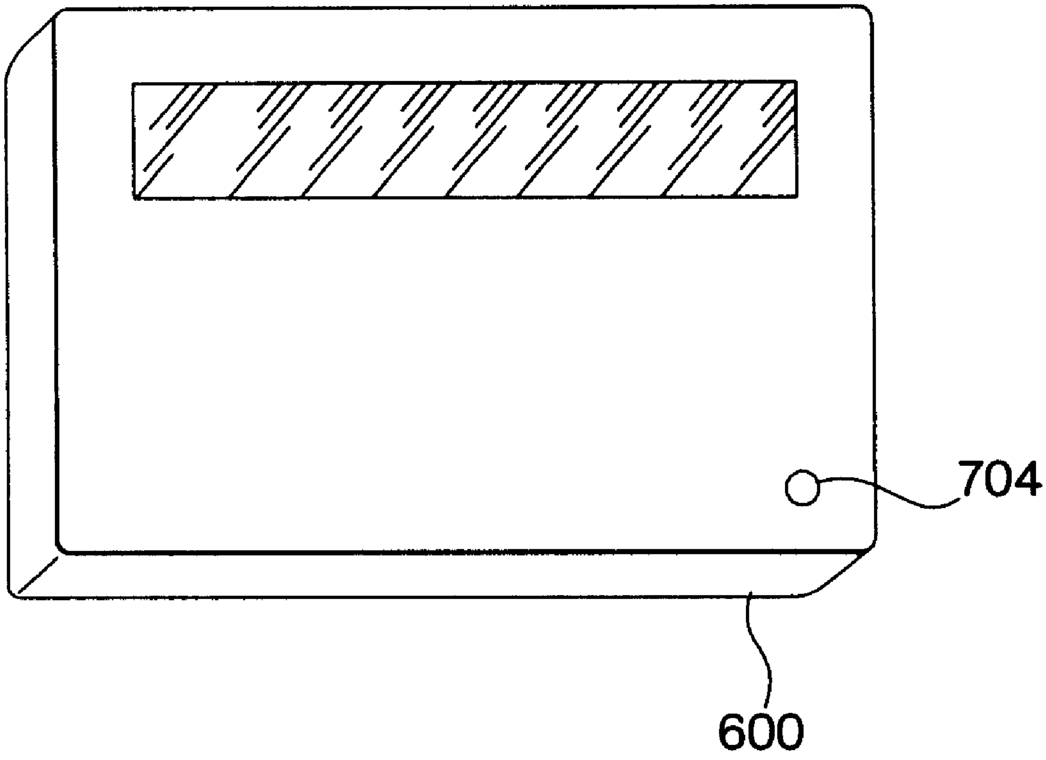
FIG. 8 shows an embodiment of the invention having a through-hole in the housing wall.

As shown in FIG. 8, a signal alert device of the invention comprises at least one through-hole 704 in the housing 600, thus forming a helmholz resonator. Because resonance frequency depends on the stiffness of the cavity and the mass of air which oscillates in the through-hole, the through-hole serves to improve the radiating efficiency at a fixed frequency as well as to smooth out the overall acoustic frequency response by controlling the volume of air the electroactive element is moving against. The placement, number, size of the through-holes can be altered in order to optimize the acoustic response.

Figure 9:
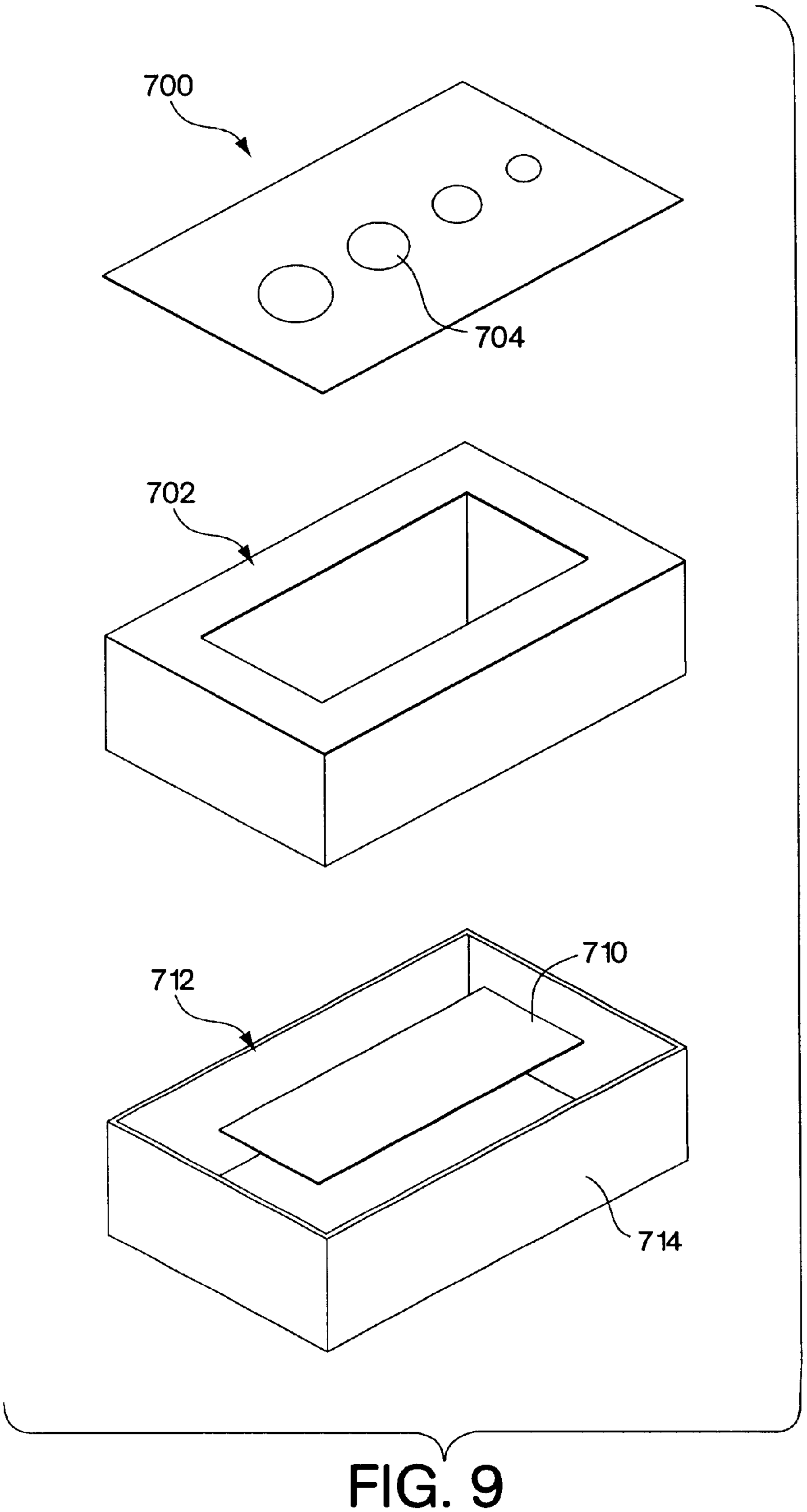
FIG. 9 shows an embodiment of the invention prepared as a test device.
Figure 10:
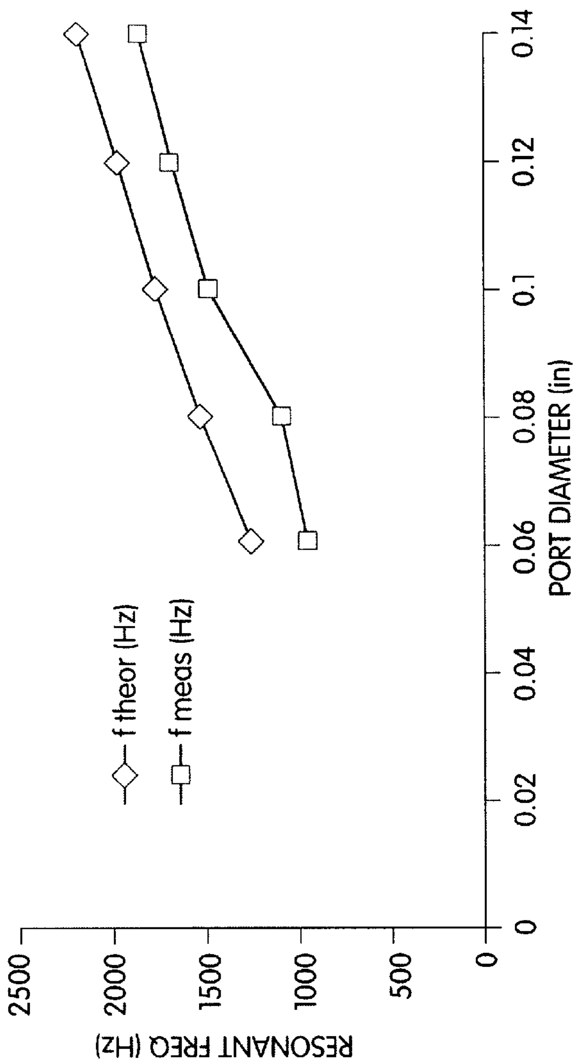
FIGS. 10–14 show the results of a series of experiments performed on a test device.
Figure 11:
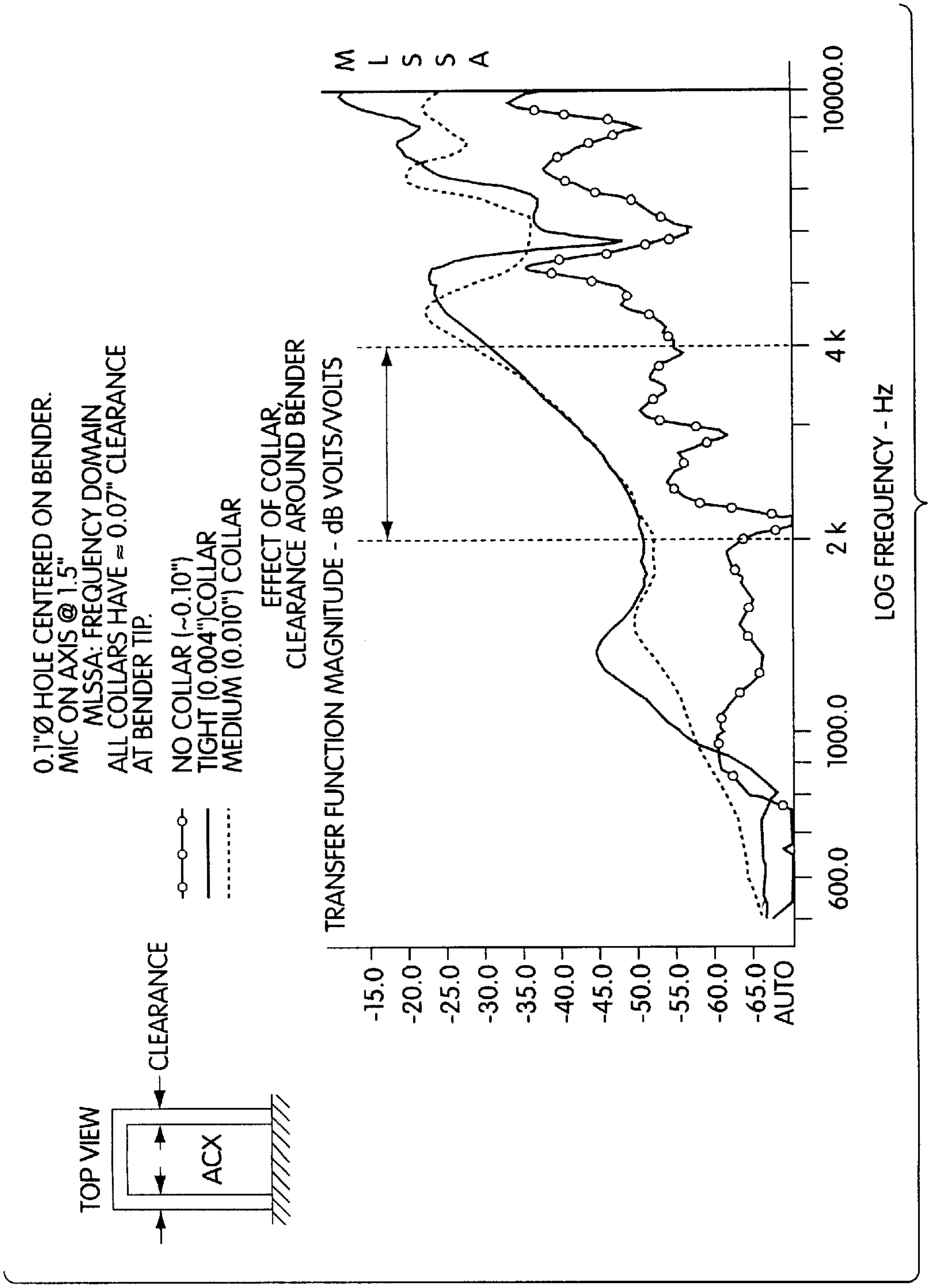
Figure 12:
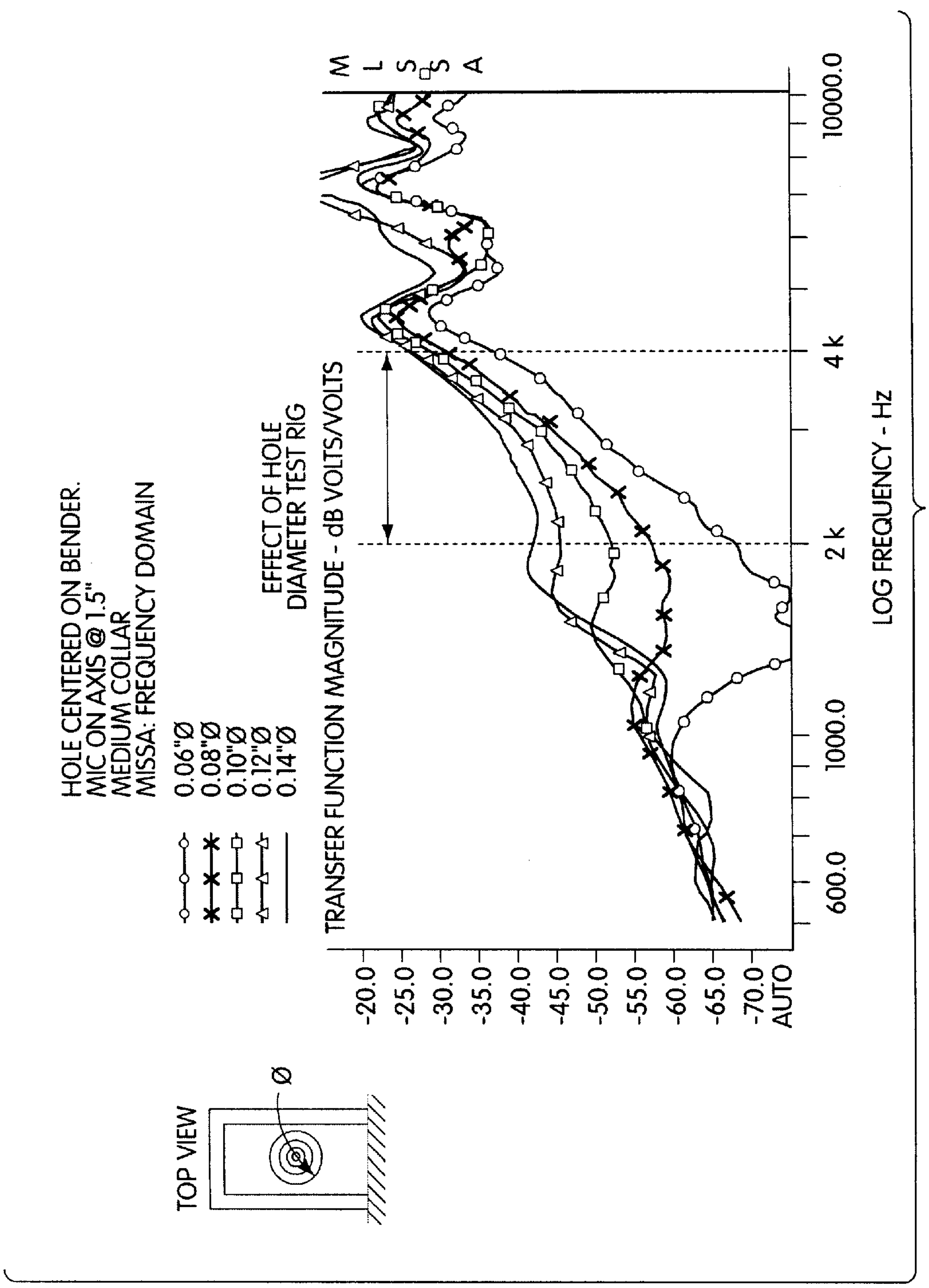
Figure 13:
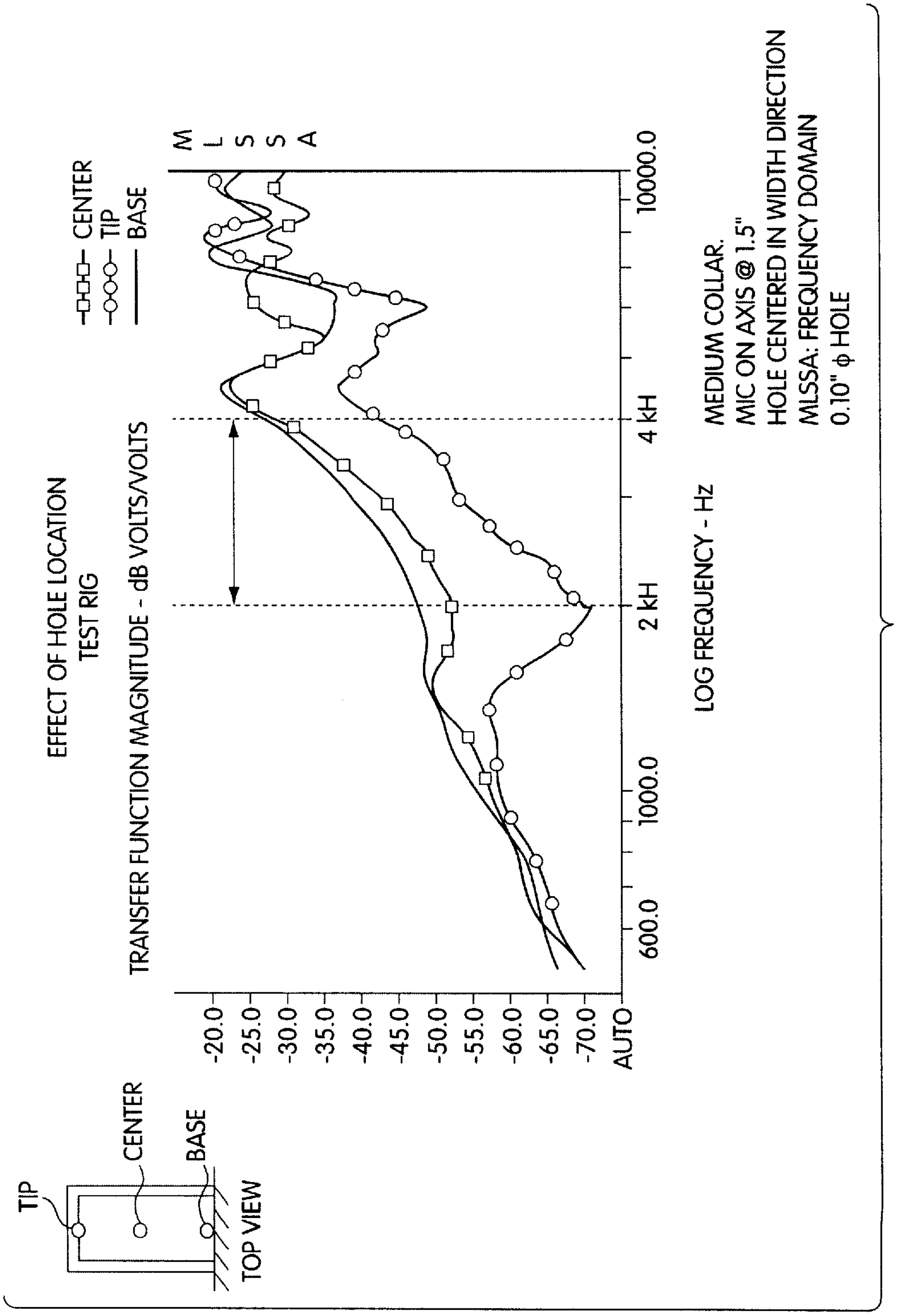
Figure 14:
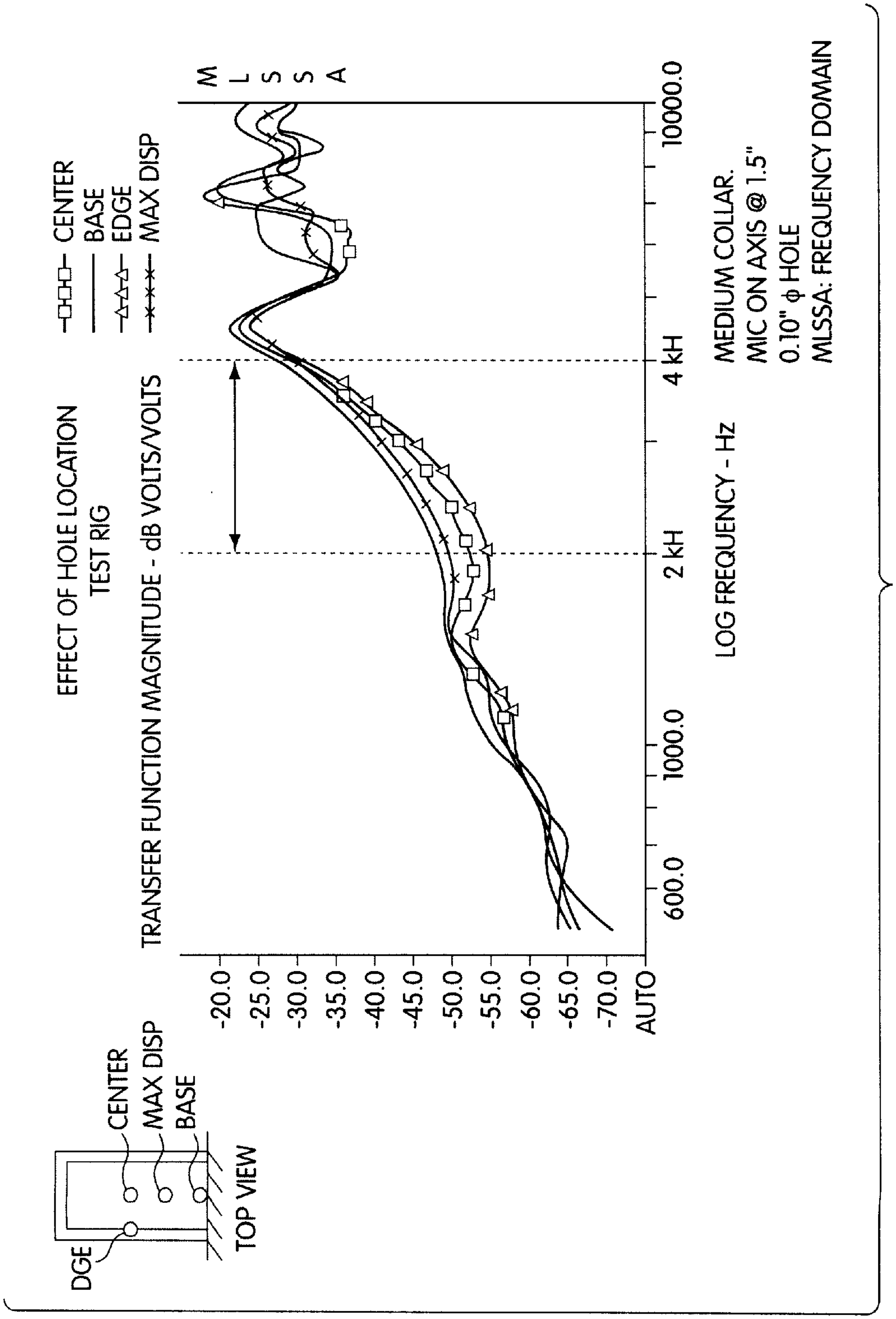

In series of experiments, a test device, or "test rig," was prepared, as shown in FIG. 9. The test rig comprised a housing body 714, a top plate 700 of the housing, a bender 710, and a collar 702. The housing body 714 and the bender 710 defined a cavity 712. The top plate comprised one or more through-holes 704, or "ports." The port size and location were varied, the clearance around the bender was varied, and the cavity size was varied. The results of series of experiments are shown in FIGS. 10–14.

Figure 6I:
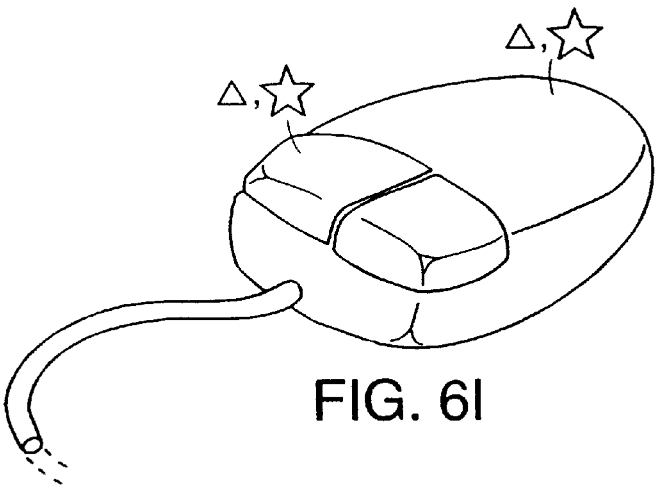
Figure 6K:
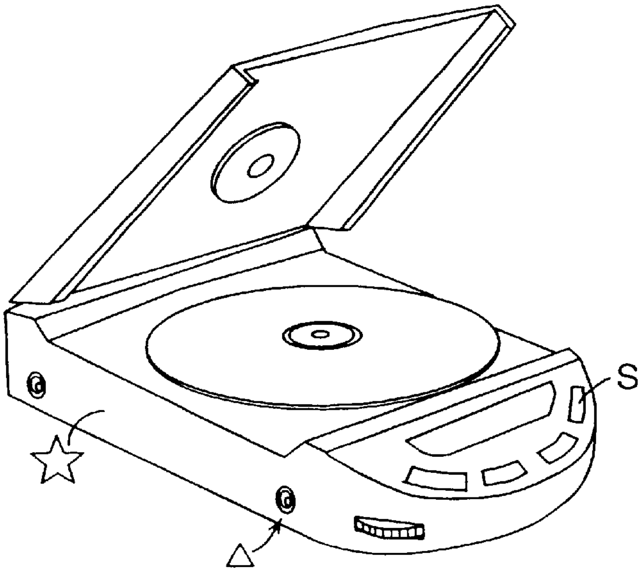
Figure 6L:
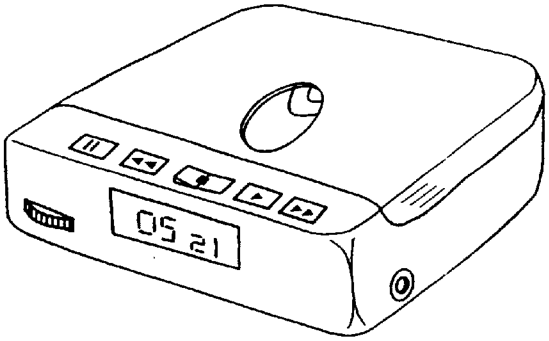
Figure 6J:
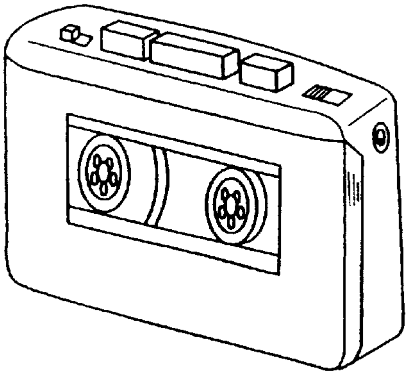

In another embodiment of the invention, the device is configured as a computer mouse in which both the control buttons and the palm region may be fitted to a module to produce sound or tactile signals, and the button or buttons may further function biodirectionally to also receive user input—e.g. to function as touch-switches or force sensors, as shown in FIG. 6I. Finally, for devices such as cassette players (FIG. 6J) or compact disc players (FIGS. 6K and 6L) not only may the module be configured for audio, inertial or other signals, but the module may be configured with one or more regions to act as sensors S to perform user input functions, replacing such small and easily missed control buttons as the pause, stop and repeat buttons of the prior art with larger or widely separated actuation regions of the housing. This latter feature allows a user, for example, to more easily control the device by a simple touch while the device remains in a pocket or carry bag, without the difficulty of first removing it or ascertaining by feel the position of each of the numerous small control buttons.

As will be understood, the invention is useful for relaying any type of signal that is either directly or indirectly detectable in any way to a user. For example, a signal may be acoustic or audible, vibratory or detectable as motion, ultrasonic, spoken words or music. The signal may be a constant amplitude or frequency, or it may be variable. Furthermore, the signal may be detectable as more than one signal; i.e., a signal may be both acoustic and vibratory. Alternatively, or in addition, the device may produce more than one type of signal, either simultaneously or at different times.

This completes a description of basic aspects of the invention and several exemplary embodiments, which are described both to illustrate points of departure from the prior art and show the manner of adapting representative methods and structures of the invention to specific devices. Such description will be understood as illustrative of the invention, but is not intended to limit the scope thereof. The invention being thus disclosed, variations and modifications, as well as adaptations thereof to diverse devices and improvements, will occur to those skilled in the art, and such variations, modifications and improvements are considered to be within the scope of the invention as defined by the claims appended hereto.

What is claimed is:

1. An actuator device for signaling a user comprising:

a housing comprising a shell at least partially enclosing the actuator, and an electro-active assembly comprising
- an electro-active element;
- a conductor; and
- an insulator, wherein said insulator at least partially covers said electro-active element, wherein said conductor is in direct electrical contact with said electro-active element, wherein said electro-active element, conductor, and said insulator are bonded together such that in-plane strain in said electro-active element is shear coupled between said electro-active element and said insulator;

wherein said electro-active assembly is attached to said housing such that, upon actuation, said electro-active assembly transmits energy through the housing in order to produce a signal that is detectable to the user and wherein said electro-active element comprises a first piezoceramic sheet portion mechanically attached to the housing to create an inertial response and a second piezoceramic sheet portion mechanically attached to the housing to create an acoustic response, said first and second piezoceramic sheet portions lying in different regions of the single sheet.

2. An actuator device according to claim 1, wherein said electro-active assembly is clamped to said housing.

3. An actuator device according to claim 1, wherein said electro-active assembly is at least partially bonded to said housing.

4. An actuator device according to claim 1, wherein the housing encloses a device selected from among the devices of computer, pager, beeper, cellular phone, portable music device, personal data assistant (PDA), computer mouse and components or subassemblies therefor.

5. A device housing according to claim 1, wherein the electro-active assembly is dynamically coupled with the housing to amplify response of the shell causing the shell to bend, vibrate or emit sound.

6. An actuator device according to claim 1, further comprising an electrical connection to said electro-active element, said electrical connection being achieved through a single side of said electro-active assembly.

7. An actuator device for signaling a user comprising:

a housing comprising a shell at least partially enclosing the actuator, and an electro-active assembly comprising
- an electro-active element;
- a conductor; and
- an insulator,
  - wherein said insulator at least partially covers said electro-active element,
  - wherein said conductor is in direct electrical contact with said electro-active element,
  - wherein said electro-active element, conductor, and said insulator are bonded together such that in-plane strain in said electro-active element is shear coupled between said electro-active element and said insulator;

wherein said electro-active assembly is attached to said housing such that, upon actuation, said electro-active assembly transmits energy through the housing in order to produce a signal that is detectable to the user and wherein the electro-active assembly is clamped to said housing at an end and actuated for applying an inertial impulse at its clamping point to vibrate the shell.

* * * * *